US010186643B2

(12) United States Patent
Kang

(10) Patent No.: US 10,186,643 B2
(45) Date of Patent: Jan. 22, 2019

(54) LIGHT-EMITTING MODULE AND LIGHT UNIT HAVING THEREOF

(71) Applicant: LG INNOTEK CO., LTD., Seoul (KR)

(72) Inventor: Min Soo Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/532,913

(22) PCT Filed: Nov. 27, 2015

(86) PCT No.: PCT/KR2015/012876
§ 371 (c)(1),
(2) Date: Jun. 2, 2017

(87) PCT Pub. No.: WO2016/089052
PCT Pub. Date: Jun. 9, 2016

(65) Prior Publication Data
US 2017/0352791 A1    Dec. 7, 2017

(30) Foreign Application Priority Data

Dec. 5, 2014  (KR) .................. 10-2014-0173744

(51) Int. Cl.
H01L 33/58    (2010.01)
G02B 17/08    (2006.01)
H01L 33/50    (2010.01)
H01L 33/60    (2010.01)
(Continued)

(52) U.S. Cl.
CPC .......... H01L 33/58 (2013.01); G02B 17/0856 (2013.01); G02B 19/0028 (2013.01);
(Continued)

(58) Field of Classification Search
CPC .... H01L 27/14629; H01L 33/10; H01L 33/60
See application file for complete search history.

(56) References Cited

U.S. PATENT DOCUMENTS

2007/0217195 A1    9/2007  Chen et al.
2007/0246715 A1*   10/2007 Shin ............... H01L 33/483
                                                   257/79
(Continued)

FOREIGN PATENT DOCUMENTS

CN    200734694 A    9/2007
CN    101490465 A    7/2009
(Continued)

OTHER PUBLICATIONS

International Search Report for PCT/KR2015/012876 (PCT/ISA/210) dated Mar. 18, 2016.

Primary Examiner — Jay C Chang
Assistant Examiner — Mikka Liu
(74) Attorney, Agent, or Firm — Birch, Stewart, Kolasch & Birch, LLP

(57) ABSTRACT

A light-emitting module provided in an embodiment comprises: a circuit board; a light-emitting diode arranged on the circuit board; an optical lens arranged on the light-emitting diode; a reflective sheet arranged between the optical lens and the circuit board; and an adhesive layer arranged between the reflective sheet and the circuit board, wherein the optical lens comprises: an incident surface having a recessed part on the light-emitting diode; a reflective surface for reflecting light incident on the incident surface; and a light-emitting surface arranged on the outer circumference thereof, wherein the reflective sheet includes an open area in which the light-emitting diode is arranged and the open area has a width wider than the width of the light-emitting diode and narrower than the width of the incident surface of the optical lens.

20 Claims, 14 Drawing Sheets

(51) Int. Cl.
    *H01L 33/62*     (2010.01)
    *G02F 1/1335*     (2006.01)
    *G02B 19/00*     (2006.01)
    *H01L 33/06*     (2010.01)
    *H01L 33/30*     (2010.01)
    *H01L 33/32*     (2010.01)
    *H01L 33/38*     (2010.01)
    *H01L 25/075*     (2006.01)

(52) U.S. Cl.
    CPC ..... *G02B 19/0061* (2013.01); *G02B 19/0071* (2013.01); *G02F 1/133603* (2013.01); *G02F 1/133605* (2013.01); *H01L 33/50* (2013.01); *H01L 33/502* (2013.01); *H01L 33/60* (2013.01); *H01L 33/62* (2013.01); *G02F 2001/133607* (2013.01); *H01L 25/0753* (2013.01); *H01L 33/06* (2013.01); *H01L 33/30* (2013.01); *H01L 33/32* (2013.01); *H01L 33/382* (2013.01)

(56) References Cited

U.S. PATENT DOCUMENTS

| | | | |
|---|---|---|---|
| 2008/0237617 A1* | 10/2008 | Itoh | ........................ C08G 59/18 257/98 |
| 2010/0123154 A1* | 5/2010 | Lee | ........................ H01L 33/483 257/98 |
| 2011/0170299 A1 | 7/2011 | Takase et al. | |
| 2012/0086871 A1 | 4/2012 | Yokota | |
| 2013/0121000 A1 | 5/2013 | Lee et al. | |
| 2014/0301085 A1* | 10/2014 | Hwang | ........................ F21V 5/04 362/308 |
| 2015/0117016 A1 | 4/2015 | Kim et al. | |
| 2015/0300594 A1 | 10/2015 | Lee et al. | |
| 2017/0069801 A1 | 3/2017 | Oka et al. | |

FOREIGN PATENT DOCUMENTS

| | | |
|---|---|---|
| CN | 201715383 U | 1/2011 |
| CN | 102121601 A | 7/2011 |
| CN | 102449788 A | 5/2012 |
| CN | 103982813 A | 8/2014 |
| CN | 105570831 A | 5/2016 |
| JP | 2006-337777 A | 12/2006 |
| JP | 2012-231023 A | 11/2012 |
| KR | 10-2013-0054040 | 5/2013 |
| KR | 10-2013-0061796 A | 6/2013 |
| KR | 10-2013-0070986 A | 6/2013 |
| KR | 10-2013-0073319 A | 7/2013 |
| KR | 10-2014-0061797 A | 5/2014 |
| KR | 10-2014-0145404 A | 12/2014 |

* cited by examiner

[Fig. 1]
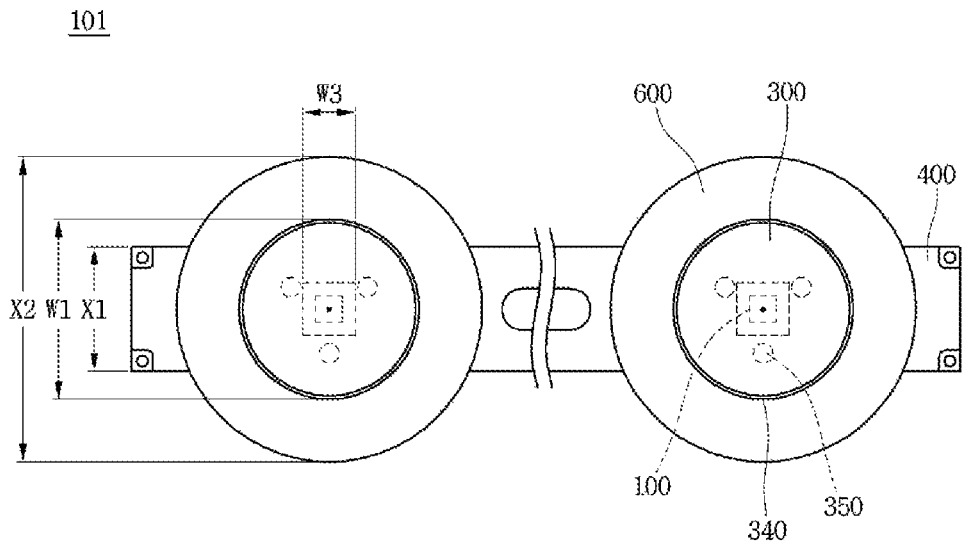
[Fig. 2]
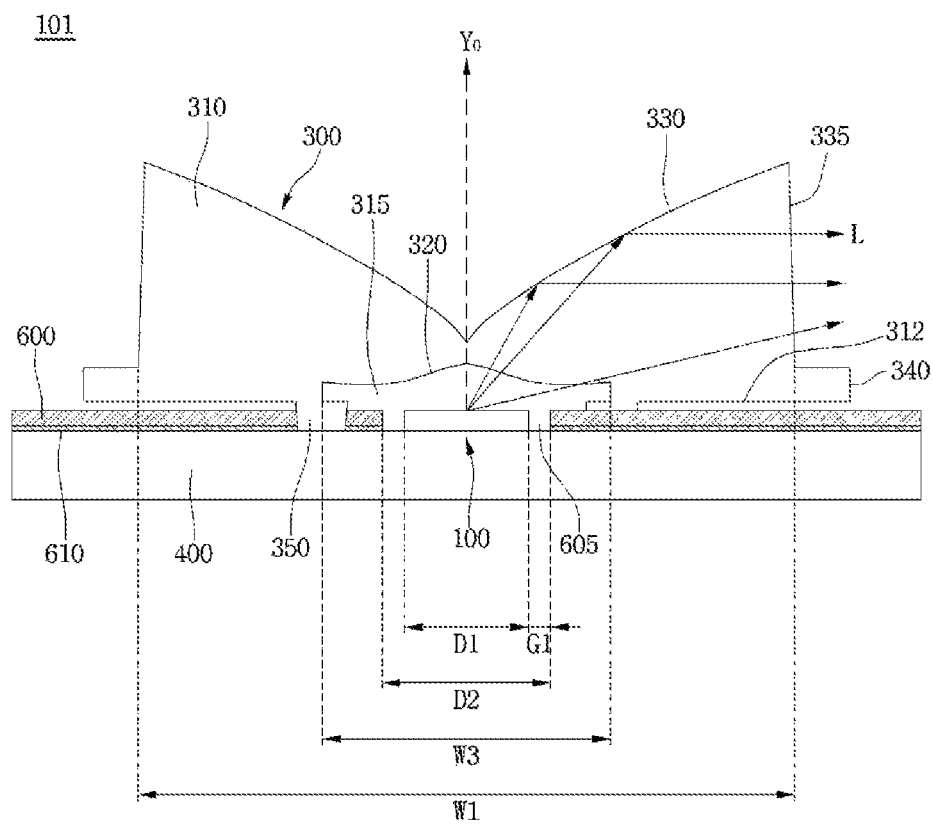

[Fig. 3]
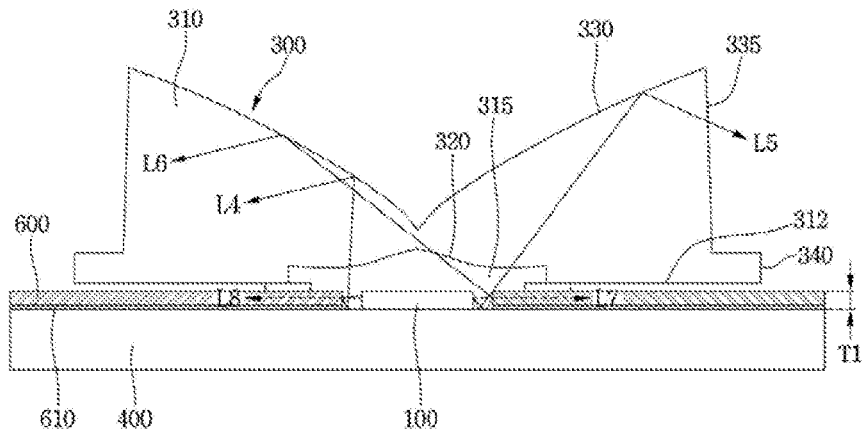
[Fig. 4]
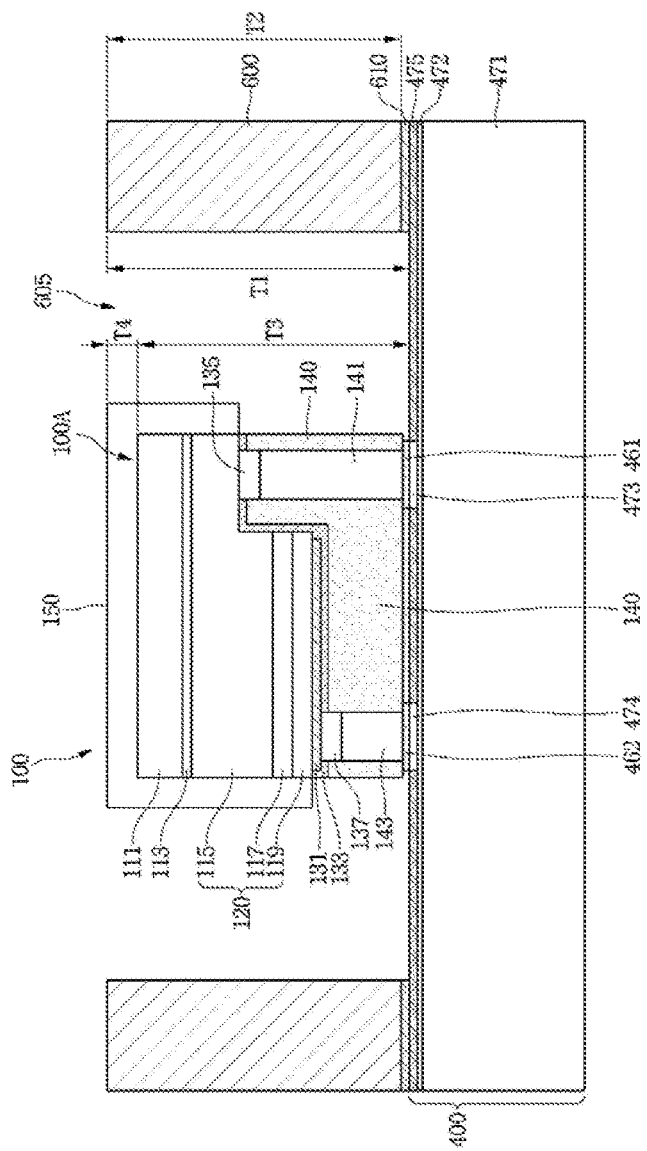

[Fig. 5]
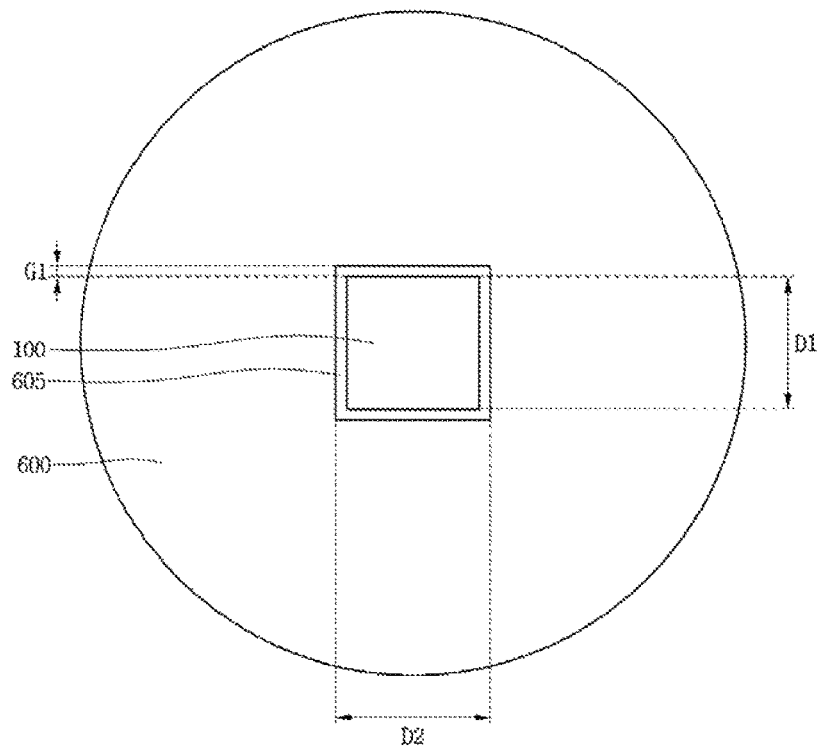
[Fig. 6]
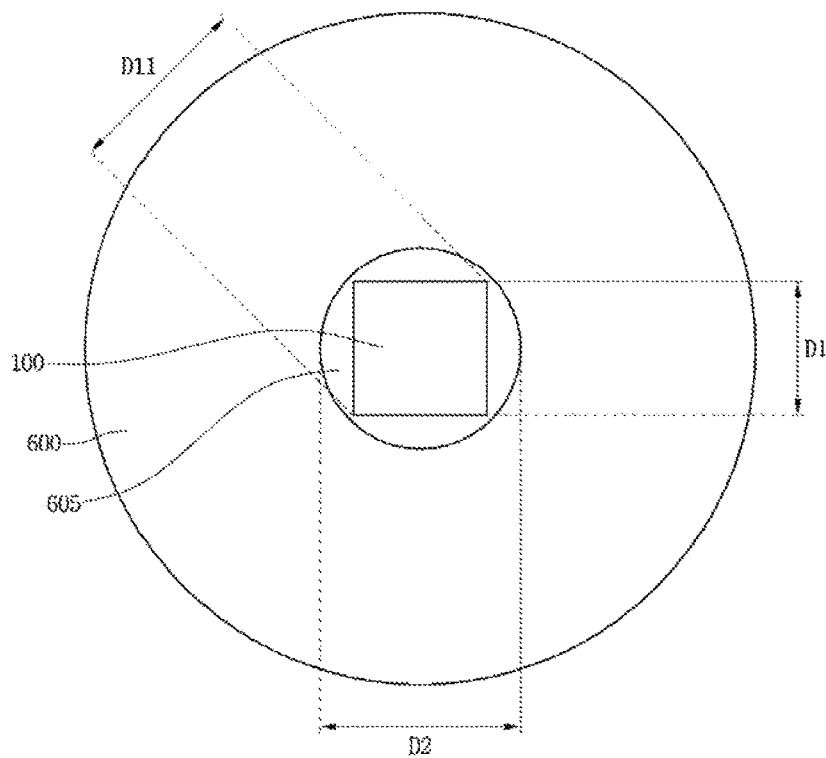

[Fig. 7]
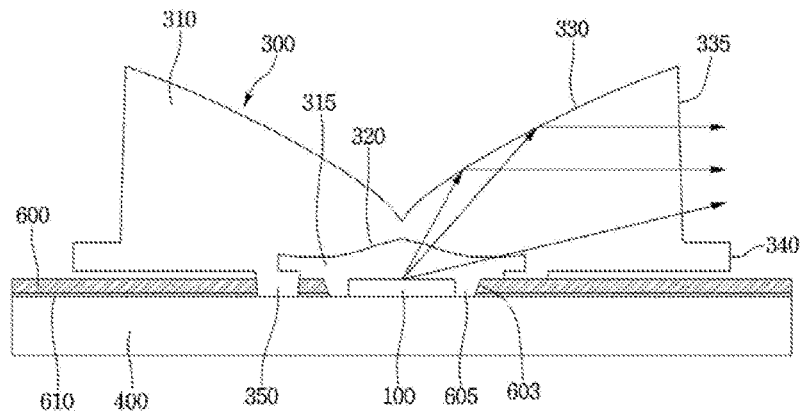
[Fig. 8]
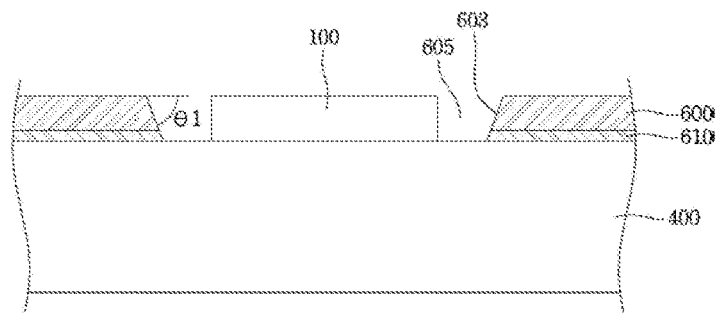
[Fig. 9]
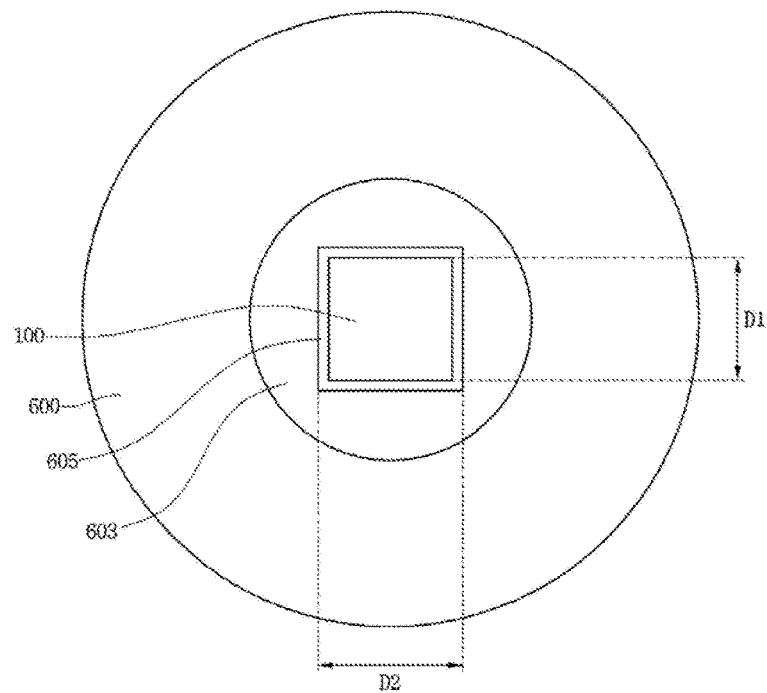

[Fig. 10]
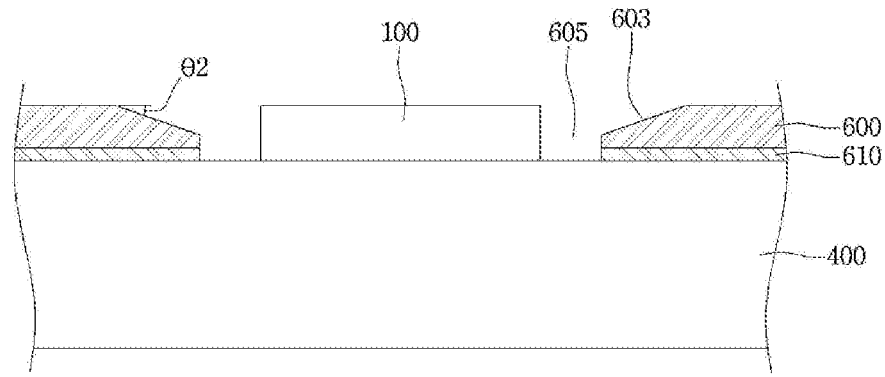
[Fig. 11]
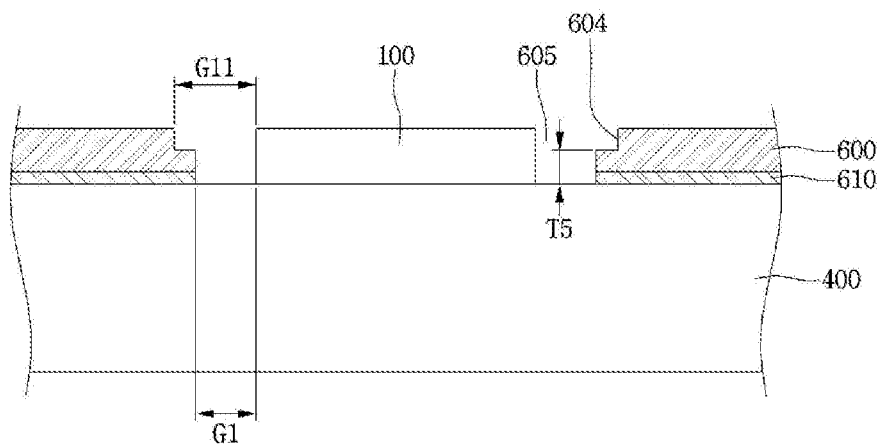
[Fig. 12]
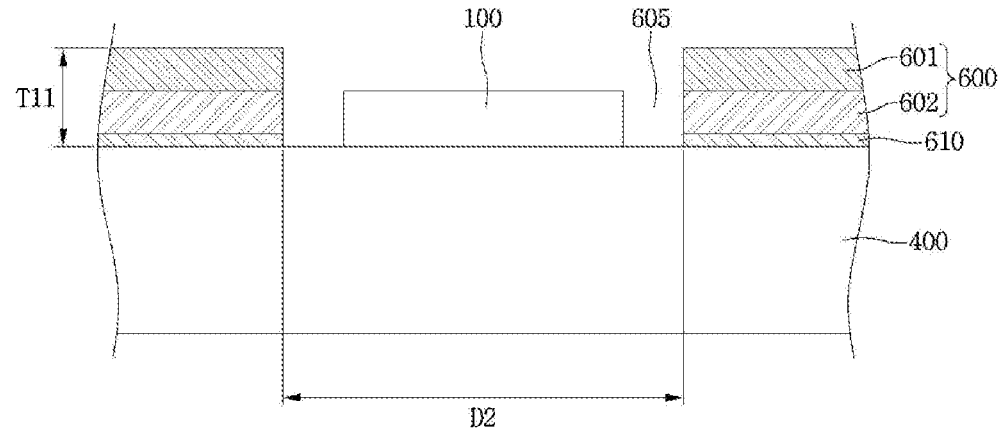

[Fig. 13]
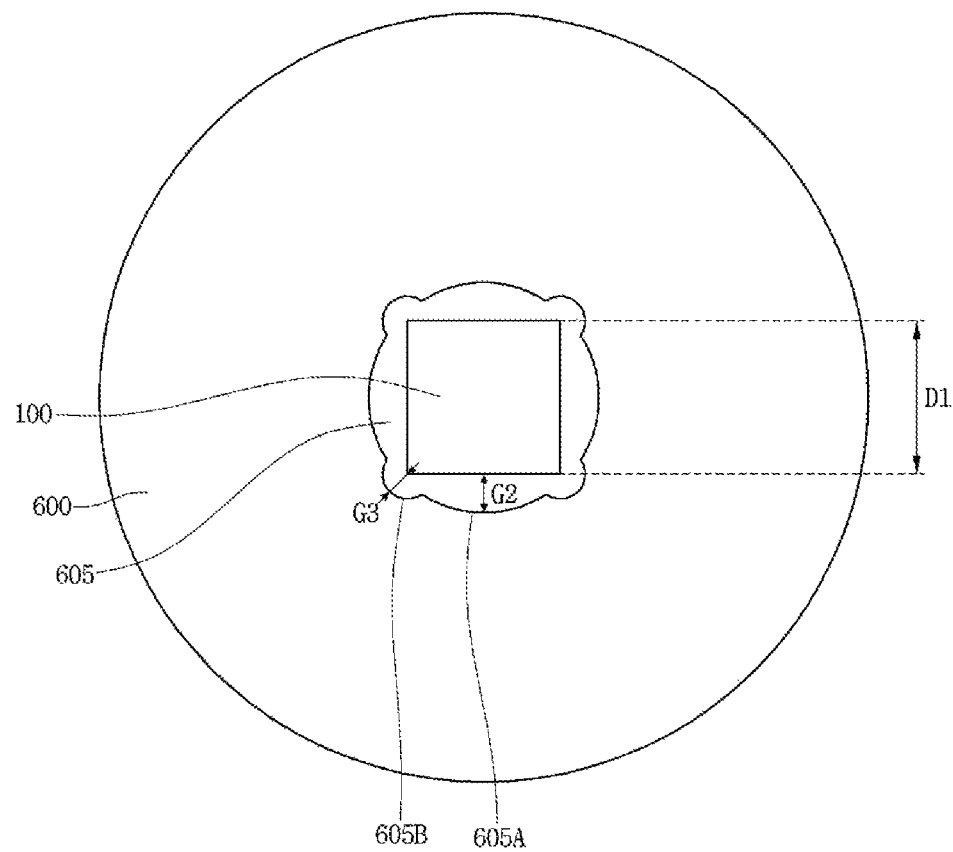
[Fig. 14]
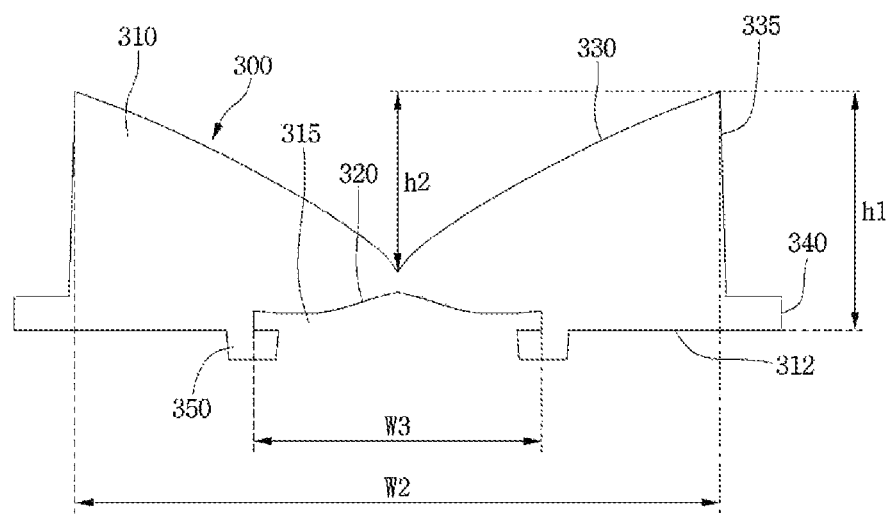

[Fig. 15]
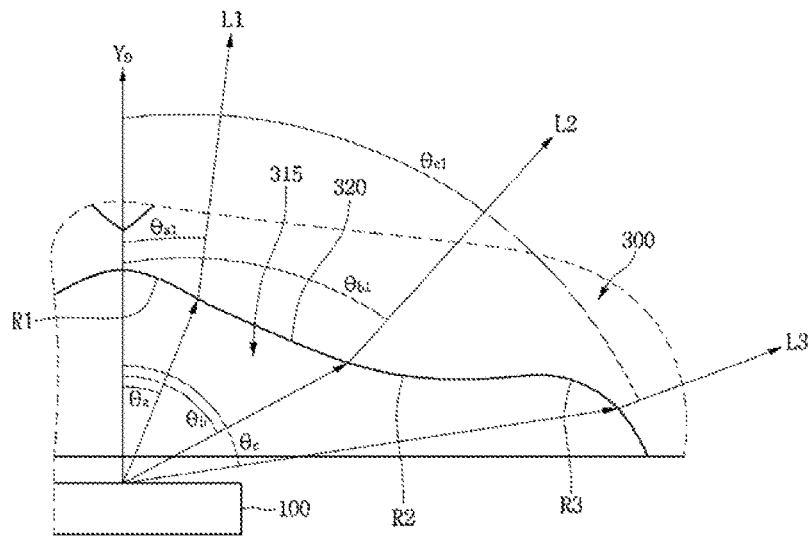
[Fig. 16]
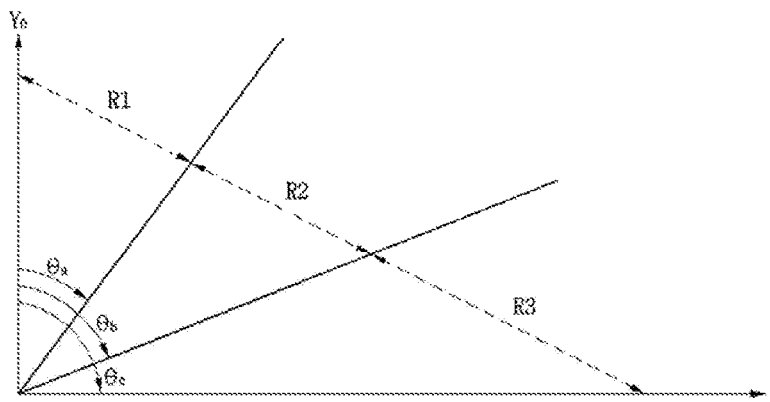
[Fig. 17]
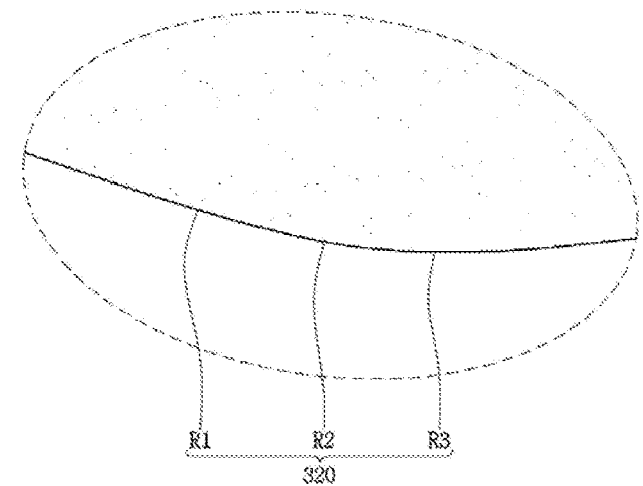

【Fig. 18】
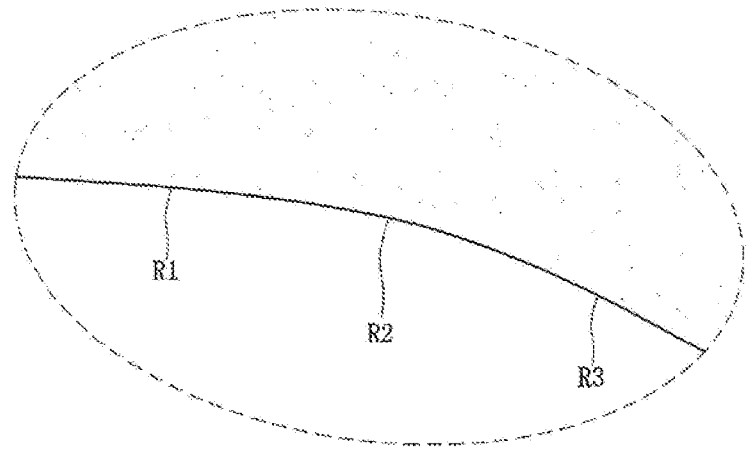
【Fig. 19】
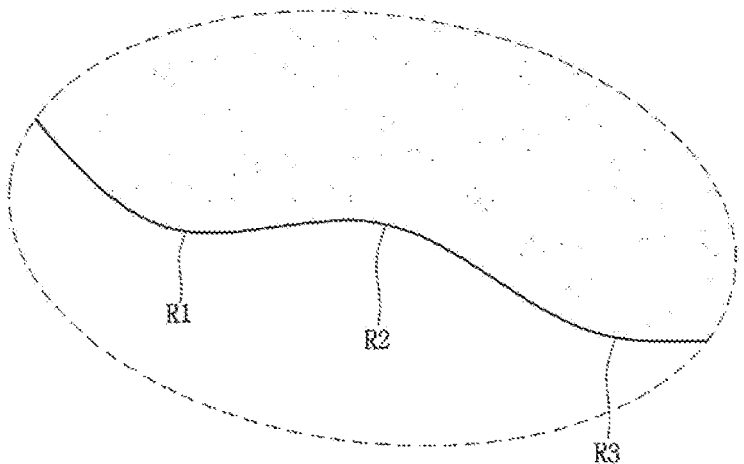
【Fig. 20】
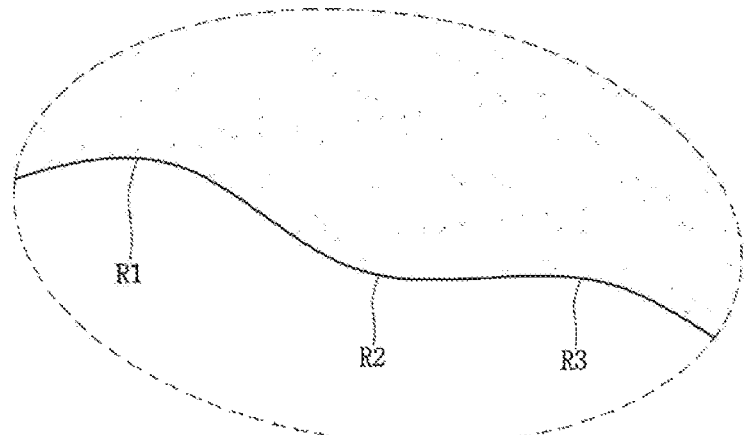

[Fig. 21]
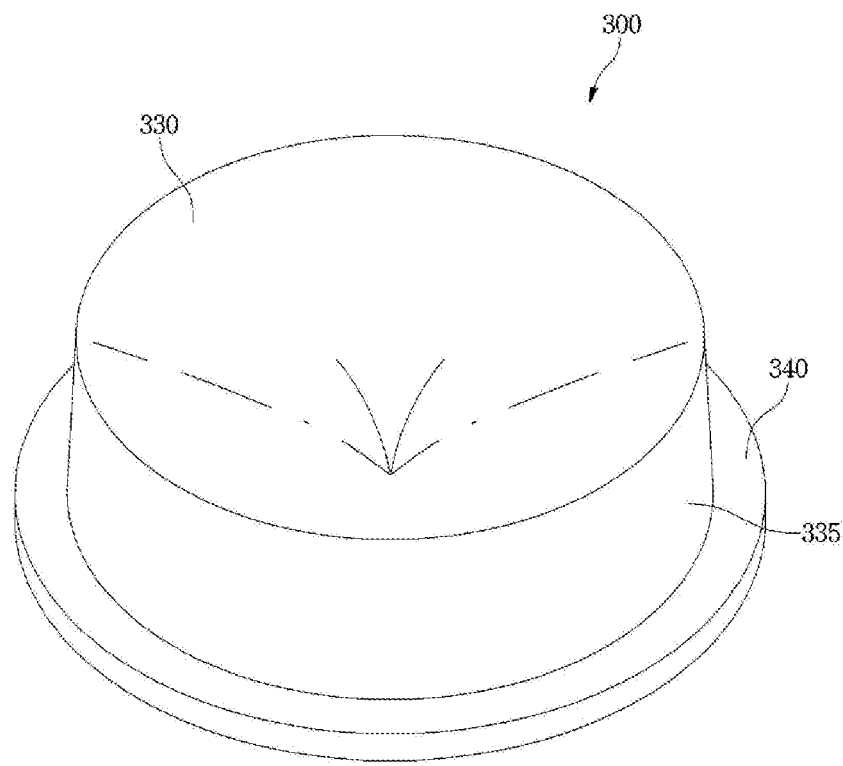
[Fig. 22]
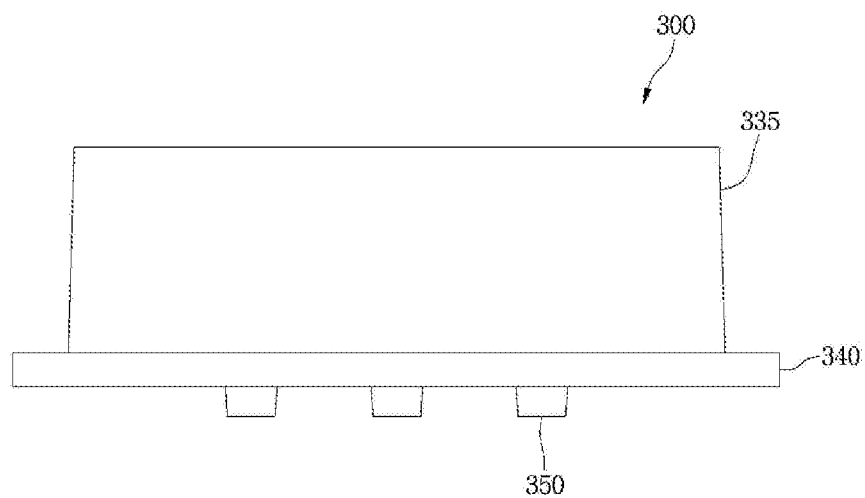

[Fig. 23]
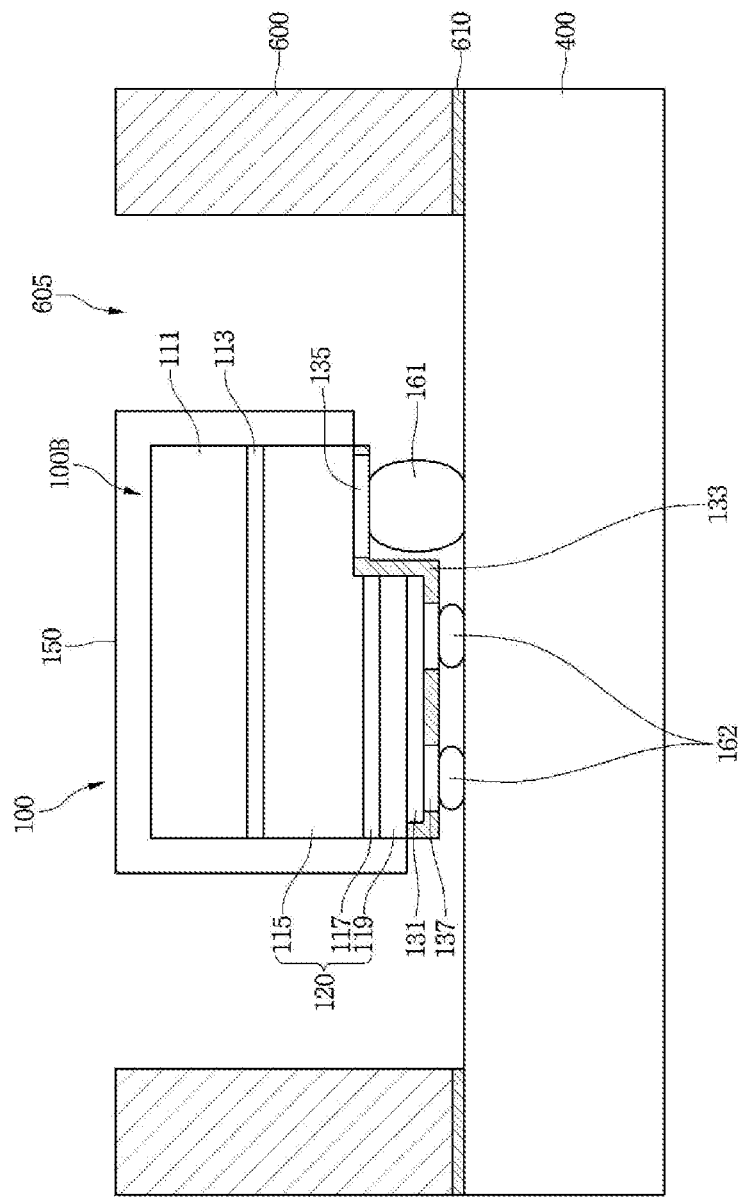

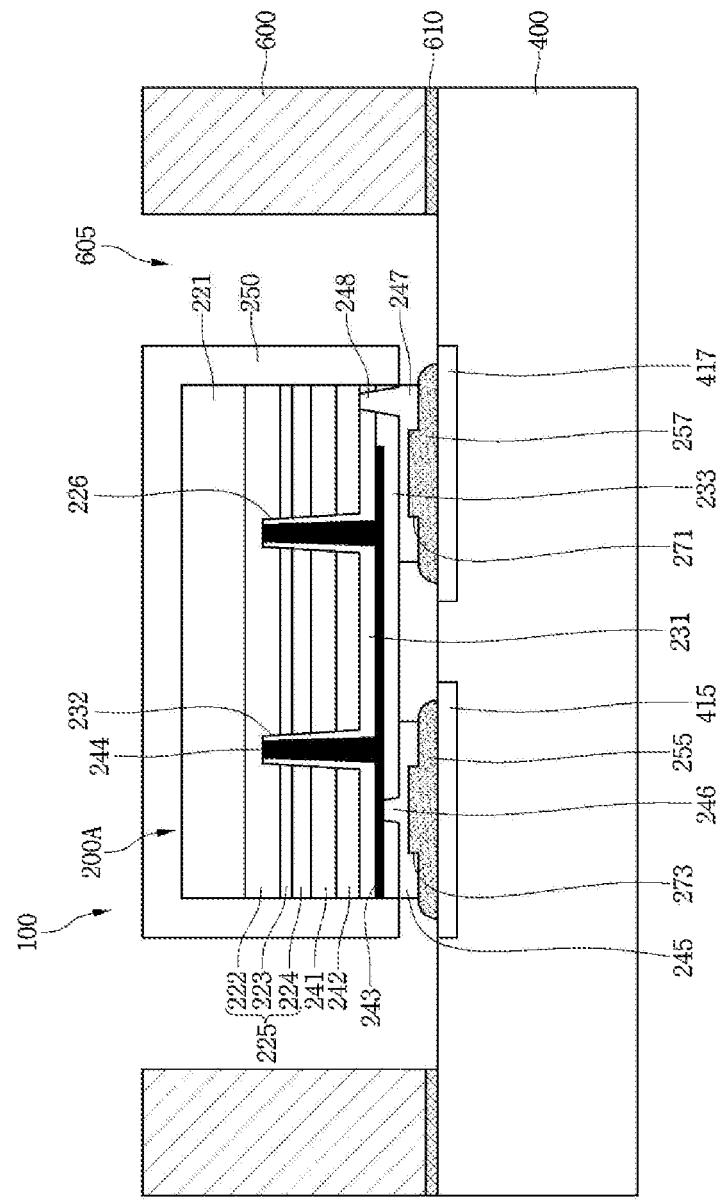
【Fig. 24】

[Fig. 25]
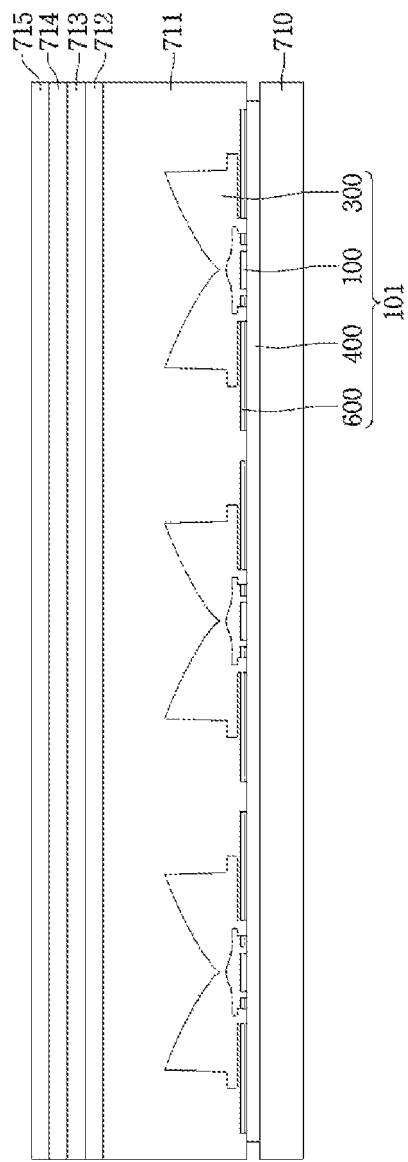

[Fig. 26]
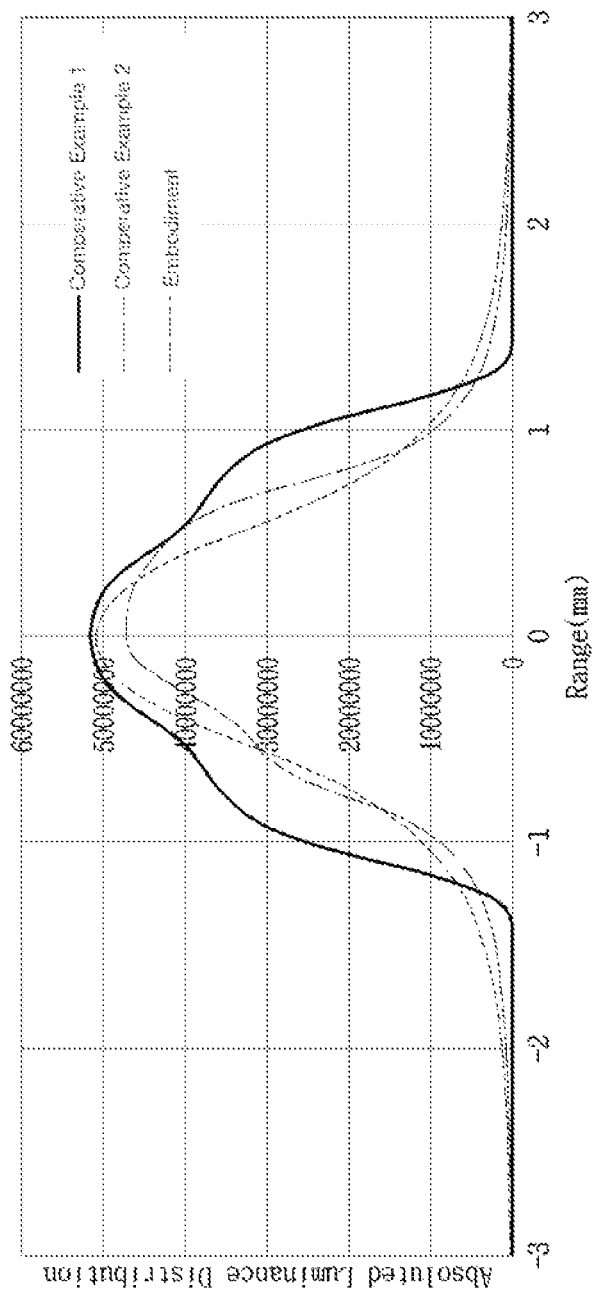

[Fig. 27]
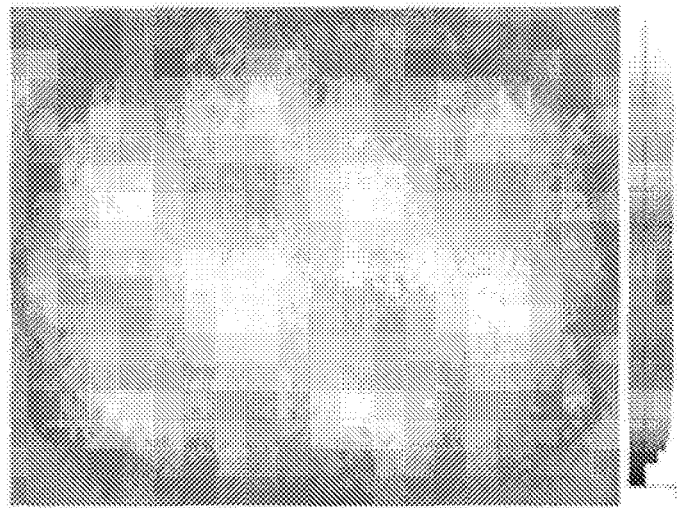
(A)
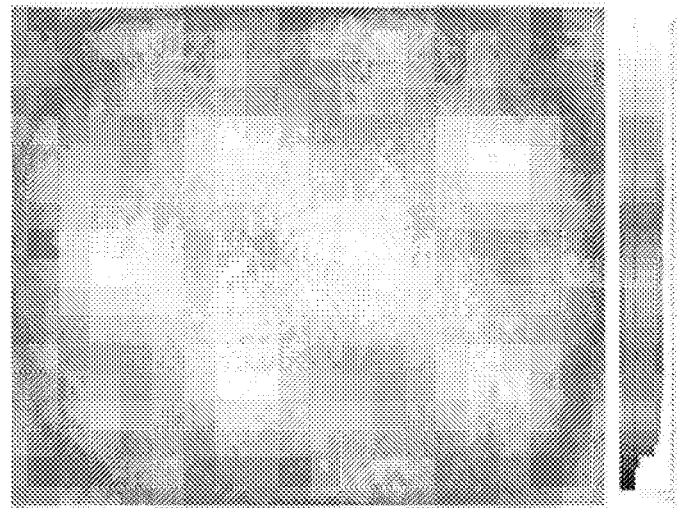
(B)

LIGHT-EMITTING MODULE AND LIGHT UNIT HAVING THEREOF

CROSS REFERENCE TO RELATED APPLICATIONS

This application is the National Phase of PCT International Application No. PCT/KR2015/012876, filed on Nov. 27, 2015, which claims priority under 35 U.S.C. 119(a) to Patent Application No. 10-2014-0173744, filed in Republic of Korea on Dec. 5, 2014, all of which are hereby expressly incorporated by reference into the present application.

TECHNICAL FIELD

The present invention relates to a light-emitting module.

BACKGROUND ART

A light emitting device, for example, a light emitting diode (LED), which is a kind of a semiconductor device to convert electrical energy into light, is receiving attention as a next-generation light source in place of a conventional fluorescent lamp, incandescent lamp, and the like.

Since the light emitting diode generates light by using a semiconductor device, the light emitting diode consumes only very low power compared with an incandescent lamp that generates light by heating tungsten or a fluorescent lamp that generates light by allowing an ultraviolet ray generated through high-voltage discharge to collide with a phosphor.

In addition, since the light emitting diode generates light by using a potential gap of a semiconductor device, the light emitting diode has longer lifetime, faster response characteristics, and more eco-friendly features, compared with a conventional light source.

Therefore, many studies have been conducted to replace an existing light source with a light emitting diode. The light emitting diode is increasingly used as a light source for various lighting devices used in indoor and outdoor, such as a lamp, a display device, an electric signboard, and a street lamp.

DISCLOSURE

Technical Problem

An embodiment provides a novel optical lens and a light emitting module including the same.

An embodiment provides a light emitting module capable of reflecting a side light of a light emitting device provided under an optical lens to an incident surface of the optical lens.

An embodiment provides a light emitting module wherein an open region of a reflective sheet, in which a light emitting device is provided, is provided smaller than an incident surface of an optical lens.

An embodiment provides a light-emitting module for allowing the light emitted from top and lateral surfaces of a light emitting device to be incident on an incident surface of an optical lens.

An embodiment provides a light-emitting module in which a reflective sheet provided under an optical lens and around a light emitting device is allowed to adhere to a circuit board using an adhesive layer.

An embodiment provides a light-emitting module capable of improving the distribution of light by allowing a reflective sheet provided around a light emitting device to be provided larger than a bottom surface of an optical lens.

Technical Solution

An embodiment is provided a light-emitting module including: a circuit board; a light emitting device disposed on the circuit board; an optical lens disposed on the light emitting device; a reflective sheet disposed between the optical lens and the circuit board; and an adhesive layer disposed between the reflective sheet and the circuit board, wherein the optical lens comprises an incident surface having a concave portion on the light emitting device, a reflective surface for reflecting the light incident on the incident surface, and an exit surface disposed at the outer circumference, wherein the reflective sheet comprises an open region in which the light emitting device is disposed, and wherein the open region of the reflective sheet has a width, which is wider than the width of the light emitting device and narrower than the width of the incident surface of the optical lens.

An embodiment is provided a light-emitting module including: a circuit board; a light emitting device disposed on the circuit board; an optical lens disposed on the light emitting device; a reflective sheet disposed between the optical lens and the circuit board; and an adhesive layer disposed between the reflective sheet and the circuit board, wherein the optical lens comprises an incident surface having a concave portion on the light emitting device, and an exit surface for emitting the light incident on the incident surface, and wherein the reflective sheet has an inner side facing a lateral surface of the light emitting device under the concave portion.

Advantageous Effects

As described above, according to the present invention, the embodiment may reduce the noise, such as a hot spot, due to the light extracted from the optical lens.

The embodiment may improve the distribution of light by changing the path of the side light of the light emitting device provided under the optical lens.

The embodiment may improve the uniformity of light by allowing the reflective sheet on the circuit board to be provided larger than the optical lens.

The embodiment may improve the reliability of the light emitting module having the optical lens.

The embodiment may improve the reliability of the light unit having the optical lens.

The embodiment may improve the reliability of the illumination system having the optical lens.

DESCRIPTION OF DRAWINGS

FIG. 1 is a plane view of a light emitting module according to an embodiment.

FIG. 2 is a side cross-sectional view of the light emitting module of FIG. 1.

FIG. 3 is a partial enlarged view of FIG. 2.

FIG. 4 is a view showing the light emitting device and the circuit board in FIG. 2.

FIGS. 5 to 13 are views showing examples of open regions of the reflective sheet according to the embodiment.

FIG. 14 is a side cross-sectional view of the optical lens in FIG. 2.

FIGS. 15 and 16 are views showing the extraction path of the light emitted from the light emitting device in FIG. 2.

FIGS. 17 to 20 are views showing and illustrating examples of the incident surface of the optical lens according to an embodiment.

FIG. 21 is a perspective view of the optical lens of the light emitting module in FIG. 2.

FIG. 22 is a side view of the optical lens in FIG. 12.

FIG. 23 is a view showing another example of the light emitting device in the light emitting module in FIG. 2.

FIG. 24 is a view showing another example of the light emitting device in the light emitting module in FIG. 2.

FIG. 25 is a view showing a display device having the light emitting module in FIG. 1.

FIG. 26 is a graph showing the comparison of light intensity between an embodiment and comparative examples.

FIGS. 27A and 27B are views showing the comparison of hot spot phenomenon between an embodiment and a comparative example.

BEST MODE

Mode for Invention

The following embodiments will be apparently understood with reference to accompanying drawings and the following description of the embodiments. In the description of the embodiment, it will be understood that, when a layer (or film), a region, a pattern or structures are referred to as being "on" or "under" a substrate, another layer (film), another region, another pad, or other patterns, each can be "directly" or "indirectly" on the other layer (or film), region, pad, or patterns, or one or more intervening layers may also be present. Such a position of each layer will be described with reference to the drawings.

Hereinafter, a light emitting module according to an embodiment will be described with reference to accompanying drawings.

FIG. 1 is a plane view of a light emitting module according to an embodiment; FIG. 2 is a side cross-sectional view of the light emitting module of FIG. 1; FIG. 3 is a partial enlarged view of FIG. 2; and FIG. 4 is a view showing the light emitting device and the circuit board in FIG. 2.

Referring to FIGS. 1 to 4, a light emitting module 101 includes a light emitting device 100, an optical lens 300 disposed on the light emitting device 100, a circuit board 400 disposed under the light emitting device 100, and a reflective sheet 600 disposed around the light emitting device 100 and disposed between the optical lens 300 and the circuit board 400.

As shown in FIG. 1, in the light emitting module 101, a plurality of optical lenses 300 may be arranged at predetermined intervals on the circuit board 400. The light emitting devices 100 and the reflective sheets 600 are disposed between the circuit board 400 and the respective optical lenses 300. A plurality of reflective sheets 600 may be disposed between the respective optical lenses 300 and the circuit board 400, and may be disposed apart from each other. The width (X2) of the reflective sheet 600 is disposed wider than the width (X1) of the circuit board 400 and wider than the width (W1) of the optical lens 300. Thus, the reflective sheet 600 may effectively reflect the light incident on the circumference of the optical lens 300. The outer shape of the reflective sheet 600 may be a circular, elliptic, or polygonal shape, but is not limited thereto.

The light emitting device 100 operates by receiving power from the circuit board 400. The optical lens 300 may receive the light emitted from the light emitting device 100, change the path of the light, and then extract the light to the outside.

As shown in FIGS. 2 and 3, the light emitting device 100 may include an LED chip having a compound semiconductor, for example, at least one of an ultraviolet (UV) LED chip, a blue LED chip, a green LED chip, a white LED chip, and a red LED chip. The light emitting device 100 may contain at least one or all of Group II-VI compound semiconductors and Group III-V compound semiconductors. The light emitting device 100 may emit at least one of a blue, green, blue, UV or white light.

The optical lens 300 may contain a transparent material. The optical lens 300 may contain at least one of polycarbonate (PC), poly methyl methacrylate (PMMA), silicone or epoxy resin, or glass. The optical lens 300 may contain a transparent material having a refractive index in the range of 1.4 to 1.7.

The optical lens 300 includes an incident surface 320 having a concave portion 315 in a direction of an optical axis ($Y_0$) from a bottom surface 312, a reflective surface 330 disposed on the opposite side to the bottom surface 312 and the incident surface 320, and an exit surface 335 at the outer circumference through which light is transmitted.

The bottom surface 312 of the optical lens 300 may be disposed as a flat surface or as an uneven surface. When the bottom surface 312 is disposed as an uneven surface, the traveling path of light may be changed.

The incident surface 320 of the optical lens 300 includes a concave portion 315 concaved in the center region of the bottom surface 312, and the concave portion 315 is recessed in a direction of the reflective surface 330 and may have a deeper depth toward the central region of the incident surface 320. The light emitted from the light emitting device 100 is incident on the incident surface 320. The outer shape of the concave portion 315 may include a circular shape or a polygonal shape.

The width W3 of the incident surface 320 may be the width of the concave portion 315, and may be disposed wider than the width D1 of the light emitting device 100. The incident surface 320 and the concave portion 315 have such a size that the light emitted from the light emitting device 100 may be easily incident thereon. The entire region of a top surface of the light emitting device 100 may be disposed to overlap the region of the concave portion 315 in a vertical direction.

The reflective surface 330 may function as a total reflective surface, and is concavely recessed in a direction of the incident surface 320 from the top surface of the optical lens 300. The reflective surface 330 has a deeper structure as it is adjacent to the light emitting device 100. The reflective surface 330 is disposed in the entire region of the top surface of the optical lens 300 or in a wider region than the concave portion 315, so that the light refracted through the incident surface 320 may be reflected to the exit surface 334. The reflective surface 330 may not be formed.

The exit surface 335 is disposed on the outer circumference of a body 310 of the optical lens 300, and the light incident through the incident surface 320 and the light reflected by the reflective surface 330 transmit the exit surface 335. The optical lens 300 may be defined as a side reflective lens that reflects the light emitted from the light emitting device 100 in a side direction.

The optical lens 300 includes a protrusion structure 340. The protrusion structure 340 may protrude further outward than the exit surface 335 under the exit surface 335 of the optical lens 300. The protrusion structure 340 may protrude into a plurality of regions or all regions of the lower circumference of the exit surface 335. Such a protrusion structure 340 may be used to support an injection molded product in an injection process of the optical lens 300.

The optical lens 300 includes a support protrusion 350 disposed below. The support protrusion 350 protrudes downward from the bottom surface 312 of the optical lens 300, that is, toward the circuit board 400. A plurality of support protrusions 350 are spaced apart from each other to be fixed onto the circuit board 400 through the reflective sheet 600, and may prevent the tilting of the optical lens 300. A protrusion hole into which the support protrusion 350 is inserted may be disposed in the reflective sheet 600.

One or more light emitting devices 100 are arranged on the circuit board 400, and the circuit board 400 may include circuit layers electrically connected to the light emitting devices 100. The circuit board 400 may contain at least one of a PCB of a resin material, a metal core PCB (MCPCB), and a flexible PCB (FPCB), but is not limited thereto.

The reflective sheet 600 is disposed between the circuit board 400 and the optical lens 300. The reflective sheet 600 includes an open region 605, and the light emitting device 100 is disposed in the open region 605. In addition, the light emitted through the lateral surface of the light emitting device 100 may be reflected by an inner side of the reflective sheet 600 to be incident on the incident surface 320.

The reflective sheet 600 may be formed of, for example, polyethylene terephthalate (PET), polycarbonate (PC), or polyvinylchloride (PVC) resin, but is not limited thereto.

As shown in FIG. 2, the light L emitted through the top surface of the light emitting device 100 is incident on the incident surface 320 of the optical lens 300, reflected by the reflective surface 330, and extracted to the exit surface 335. The light reflected by the reflective surface 330 is extracted through the exit surface 335 disposed at the outer circumference of the optical lens 300, thereby increasing the view angle distribution of light.

As shown in FIG. 3, the lights L4, L5, and L6 emitted through the lateral surface of the light emitting device 100 may be reflected by the inner side of the reflective sheet 600 in the open region 605 of the reflective sheet 600 or reflected by the top surface of the circuit board 400, incident on the incident surface 320 of the optical lens 300, reflected by the reflective surface 330, and then extracted to the outside.

As shown in FIGS. 3 and 4, the reflective sheet 600 may adhere to the circuit board 400 by an adhesive layer 610. The adhesive layer 610 may contain an insulating material, for example, a resin material, such as silicone or epoxy, or may include a double-sided tape. The adhesive layer 610 may be thinner than the thickness T2 of the reflective sheet 600, and for example, the thickness of the adhesive layer 610 may be in the range of 30 μm to 50 μm or ⅕ or less of the thickness of the reflective sheet 600. If the thickness of the adhesive layer 610 is thicker than the above range, the loss of light through the adhesive layer 610 may occur. If the thickness of the adhesive layer 610 is thinner than the above range, the adhesive effect may deteriorate.

As shown in FIG. 2, the width D2 of the open region 605 of the reflective sheet 600 may be disposed wider than the width D1 of the light emitting chip 100A. The top view shape or outer shape of the open region 605 may be the same as or different from the outer shape of the light emitting device 100. The width D2 of the open region 605 of the reflective sheet may be disposed smaller than the width W3 of the incident surface 320 or the width of the concave portion 315 of the optical lens 300. The open region 605 of the reflective sheet 600 may be disposed to overlap the region of the incident surface 320 of the optical lens in a vertical direction. The top view shape or outer shape of the open region 605 of the reflective sheet 600 may include at least one of a circular shape, a polygonal shape, and a curved shape. The inner side of the reflective sheet 600 may face at least a lateral surface or all lateral surfaces of the light emitting device 100. The inner side of the reflective sheet 600 may be disposed around the light emitting device 100. An inside portion of the reflective sheet 600 may be disposed under the concave portion 315. An outside portion of the reflective sheet 600 may be disposed further outward than the incident surface 320 of the optical lens 300. In the open region 605 of the reflective sheet 600, an air space may be disposed in a space between the light emitting device 100 and the inner side of the reflective sheet 600, so that the inner side of the reflective sheet 60 may face the lateral surface of the light emitting device 100 through the air space.

The open region 605 of the reflective sheet 600 is disposed under the incident surface 320 of the optical lens 300, so that the reflective sheet 600 may reflect the light traveling through the open region 605 to the incident surface 320 of the optical lens 300. In addition, a portion of a protective layer 475 (in FIG. 4) is exposed under the open region 605 of the reflective sheet 600, and the portion of the protective layer 475 may partially reflect the light traveling to the open region 605. The reflective sheet 600 prevents the loss of the light emitted to the lateral surface of the light emitting device 100, thereby improving a hot spot phenomenon in the periphery of the light emitting device 100. The reflective sheet 600 reflects the light emitted to the lateral surface of the light emitting device 100 or the light incident through the bottom surface 312 of the optical lens 300.

With respect to the open region 605 of the reflective sheet 600, the reflective sheet 600 may be spaced apart from the light emitting device 100 at a predetermined interval G1. The interval G1 may be a process margin for mounting the light emitting device 100, but is not limited thereto. The interval G1 between the reflective sheet 600 and the light emitting device 100 may range from 70 μm or more to less than the width W3 of the concave portion 315. If the interval G1 is narrower than the above range, the light emitting device 100 may be difficult to mount, and if the interval G1 is wider than the above range, the path of the light emitted through the lateral surface of the light emitting device 100 may be difficult to control or the light may be incident on a region other than the incident surface 320.

If the reflective sheet 600 is not disposed around the light emitting device 100, the lights L7 and L8 emitted through the lateral surface of the light emitting device 100 are reflected on the circuit board 400 or travel in different paths as shown in FIG. 3, failing to provide a uniform distribution of light. That is, the path of the light traveling to the lateral surface of the light emitting device 100 is difficult to control, and thus, a hot spot phenomenon may occur in an undesired region. In the embodiment, a wire is not connected to the light emitting device 100, and thus, the outer shape of the open region 605 may be disposed as a shape the same as the outer shape of the light emitting device 100 or may be disposed within a predetermined region.

A height T1 of the top surface of the reflective sheet 600 may be set to a height enough to cover light emitted from a side of the light emitting device 100. The height T1 of the top surface of the reflective sheet 600 may be a straight distance from the top surface of the circuit board 400 to the top surface of the reflective sheet 600. The height T1 of the top surface of the reflective sheet 600 may be equal to or higher than a height T3 of the top surface of the light emitting chip 100A as shown in FIG. 4. As shown in FIG.

4, the height T1 of the top surface of the reflective sheet 600 may be spaced apart from the height T3 of the top surface of the light emitting chip 100A at a predetermined interval T4.

When the height T1 of the top surface of the reflective sheet 600 is lower than that of the top surface of the light emitting chip 100A, the light leaks through a region between the top surface of the reflective sheet 600 and the optical lens 300, resulting in a hot spot phenomenon. Accordingly, the height T1 of the top surface of the reflective sheet 600 is positioned at or above the top surface of the light emitting chip 100A, so that the reflective sheet 600 may reflect the light emitted through the lateral surface of the light emitting chip 100A.

The height T1 of the top surface of the reflective sheet 600 may be disposed to have an interval T4 of 100 μm or less from the top surface of the light emitting chip 100A. The height T1 of the top surface of the reflective sheet 600 may range, for example, from 350 μm to 400 μm. If the height T1 of the top surface of the reflective sheet 600 is lower than the above range, a hot spot phenomenon may occur by the light traveling between the reflective sheet 600 and the bottom surface 312 of the optical lens 300, and if the height T1 of the top surface of the reflective sheet 600 is larger than the above range, the light directly incident on the incident surface 320 of the optical lens 300 may be blocked.

In addition, in the light emitting device 100, a phosphor layer 150 may be disposed on the light emitting chip 100A as shown in FIG. 4. The height T1 of the top surface of the reflective sheet 600 may be higher than the height T3 of the top surface of the light emitting chip 100A and may be equal to or lower than that of the top surface of the phosphor layer 150. If the height T1 of the top surface of the reflective sheet 600 is higher than that of the top surface of the phosphor layer 150, the reflective sheet 600 blocks the light that may be directly incident on the incident surface 320 of the optical lens 300, and thus, the optical lens 300 is difficult to design.

As shown in FIG. 5, the top view shape or outer shape of the open region 605 of the reflective sheet 600 may have a polygonal shape, for example, a tetragonal shape. The outer shape of the light emitting device 100, which is disposed in the open region 605 of the reflective sheet 600, may have a polygonal shape, for example, a tetragonal shape. Corner regions of the open region 605 may be disposed at positions facing corner regions of the light emitting device 100. The intervals G1 between the light emitting device 100 and the reflective sheet 600 may be equal to each other. Here, the definition that the intervals C1 between the light emitting device 100 and the reflective sheet 600 are equal to each other may be that at least two of the intervals between four lateral surfaces of the light emitting device 100 and four inner side surfaces of the reflective sheet 600 have the same distance. Since the outer shape of the open region 605 and the outer shape of the light emitting device 100 are the same as each other, the occurrence of a hot spot by the light passing through the optical lens 300 may be prevented, and a uniform distribution of light may be disposed. As another example, corner portions of the open region 605 may have a curved surface, but are not limited thereto.

As shown in FIG. 6, the open region 605 of the reflective sheet 600 may have a shape different from the outer shape of the light emitting device 100, for example, a curved shape, for example, a circular shape. The outer shape of the light emitting device 100 includes a polygonal shape, for example, a tetragonal shape. The width or diameter of the open region 605 may be wider than the diagonal length D11 of the light emitting device 100. The interval between the reflective sheet 600 and the light emitting device 100 may be the largest at the center of each lateral surface of the light emitting device 100, and may be the narrowest toward a corner thereof. Such an open region 605 may reflect the side lights of the light emitting device 100 to different paths since a curved surface, that is, the inner curved surface of the reflective sheet 600 is disposed at the lateral surface of the light emitting device 100. Since the open region 605 of the reflective sheet 600 has a larger area than the bottom surface of the light emitting device 100, the light emitting device is easy to mount.

FIG. 7 is a view showing a light emitting module according to an embodiment, and FIG. 8 is a detailed view showing the reflective sheet 600 in FIG. 7.

Referring to FIGS. 7 and 8, the reflective sheet 600 is disposed on the circuit board 400, and the light emitting device 100 is disposed in the open region 605 of the reflective sheet 600. The optical lens 300 is disposed on the reflective sheet 600.

The open region 605 of the reflective sheet 600 is disposed around the light emitting device 100, and disposed under a region of the incident surface 320 of the optical lens 300. Therefore, the light emitted through the lateral surface of the light emitting device 100 may be reflected to the incident surface 320 by the reflective sheet 600.

The circumferential surface of the open region 605 of the reflective sheet 600 includes an inclined surface 603 with respect to the top surface of the reflective sheet 600. The angle θ1 of the inclined surface 603 may be disposed in a range of 45° to 89° with respect to the top surface of the reflective sheet 600. If the angle θ1 is smaller than the above range, the loss of light may occur, and if the angle θ1 is larger than the above range, the light again reflected in a direction of the light emitting device 100 may be increased. The inclined surface 603 may be disposed with respect to the overall thickness of the reflective sheet 600 and the adhesive layer 610 or the overall thickness of the reflective sheet 600.

Referring to FIGS. 9 and 10, in the reflective sheet 600, an inclined surface 603 with respect to the top surface of the reflective sheet 600 may be disposed around the open region 605. The inclined region 603 may be gradually thinner toward the open region 605. The inclined region 603 may be disposed with a size corresponding to the concave portion 315 of the optical lens 300 or a smaller size than the concave portion 315. The inclined region 603 may be disposed at an angle in the range of 1° to 30° from the top surface of the reflective sheet 600. If the angle θ2 is larger than the above range, the light may be reflected to a region out of the concave portion of the optical lens 300, and if the angle θ2 is smaller than the above range, the light may be incident on a region between the optical lens 300 and the reflective sheet 600, causing the loss of light. The inclined region 603 may be disposed to be inclined using a part, but not the entirety, of the thickness of the reflective sheet 600, for example, the thickness of an upper portion of the reflective sheet 600. Here, the thickness of the upper portion of the reflective sheet 600 may be ⅓ or more the thickness of the reflective sheet 600, but is not limited thereto.

Referring to FIG. 11, the reflective sheet 600 includes a stepped structure 604 around the open region 605. The stepped structure 604 may be disposed such that the width of an upper portion of the open region 605 is wider than the width of a lower portion of the open region 605. The height T5 of the lower portion of the stepped structure 604 of the reflective sheet 600 may be disposed lower than the height of the active layer 117 shown in FIG. 4. Therefore, the intervals G1 and G11 between the lateral surface from the light emitting device 100 and the inner sides of the reflective sheet 600 make a difference therebetween and the lights emitted from the lateral surface of the light emitting device 100 may be reflected through different paths by the intervals G1 and G11. That is, the stepped structure 604 may increase the reflective area of the inner side in the reflective sheet 600.

Referring to FIG. 12, the reflective sheet 600 may include a first layer 601 and a second layer 602. The first and second layers 601 and 602 are disposed around the light emitting device 100 and may be formed of the same material. An adhesive (not shown) may be further disposed between the first and second layers 601 and 602, but is not limited thereto.

The top surface height T11 of the reflective sheet 600 may be disposed higher than the top surface of the light emitting device 100, and may be provide at such a height that the reflective sheet 600 is not in contact with the bottom surface 312 of the optical lens 300 in FIG. 4. In addition, the width D2 of the open region 605 of the reflective sheet 600 may be the same as the width W3 of the incident surface 320 of the optical lens 300 in FIG. 4.

Since the bottom surface of the optical lens 300 and the top surface of the reflective sheet 600 are disposed adjacent to each other, the light emitted through the lateral surface of the light emitting device 100 may be prevented from traveling through a region between the top surface of the reflective sheet 600 and the bottom surface of the optical lens 300.

Referring to FIG. 13, the open region 605 of the reflective sheet 600 includes a plurality of curved surfaces 605A and 605B having different curvatures. The circumference of the open region 605 includes a first curved surface 605A having a first curvature corresponding to a lateral surface of the light emitting device 100 and a second curved surface 605B having a second curvature corresponding to a corner region of the light emitting device 100.

The first curvature of the first curved surface 605A may be greater than the second curvature of the second curved surface 605B. The first and second curved surfaces 605A and 605B having different curvatures are disposed around the outer circumference of the light emitting device 100, so that the intervals G2 and G3 between the lateral surfaces of the light emitting device 100 and the inner sides of the reflective sheet 600 may make no large difference. Therefore, the variation in the distribution of light may be reduced by the open region 605 of the reflective sheet 600. The shapes of the first and second curved surfaces 605A and 605B may include a hemispherical or elliptical shape, but are not limited thereto.

The light emitting device 100 will be described with reference to FIG. 4. The light emitting device 100 includes the light emitting chip 100A. The light emitting device 100 may include the light emitting chip 100A and the phosphor layer 150 disposed on the light emitting chip 100A. The phosphor layer 150 includes at least one or a plurality of blue, green, yellow, and red phosphors, and may be disposed as a single layer or multiple layers. In the phosphor layer 150, a phosphor is added in a transparent resin material. The transparent resin material may include a material, such as silicone or epoxy, and the phosphor may be selectively formed from YAG, TAG, silicate, nitride, and oxy-nitride materials.

The phosphor layer 150 may be disposed on the top surface of the light emitting chip 100A, or may be disposed on the top surface and the lateral surface of the light emitting chip 100A. The phosphor layer 150 may be disposed on a light emission region of the surface of the light emitting chip 100A, to convert the wavelength of light.

The phosphor layer 150 may include a single or different phosphor layers. In the different phosphor layers, a first layer may have at least one kind of red, yellow, and green phosphors, and a second layer may be formed on the first layer and may have a different phosphor from the first layer among red, yellow, and green phosphors. As another example, the different phosphor layers may include three or more phosphor layers, but are not limited thereto.

As another example, the phosphor layer 150 may include a film type. Since the film type phosphor layer provides a uniform thickness, the color distribution due to the conversion of wavelength may be uniform.

As for the light emitting chip 100A, the light emitting chip 100A may include a substrate 111, a first semiconductor layer 113, a light emitting structure 120, an electrode layer 131, an insulating layer 133, a first electrode 135, a second electrode 137, a first connection electrode 141, a second connection electrode 143, and a support layer 140.

For the substrate 111, a transparent, insulating, or conductive substrate may be used, and for example, at least one of sapphire ($Al_2O_3$), SiC, Si, GaAs, GaN, ZnO, Si, GaP, InP, Ge, and $Ga_2O_3$ may be used. At least one or both of the top surface and the bottom surface of the substrate 111 may have a plurality of convex portions (not shown), thereby improving the efficiency of light extraction. The side cross-sectional shape of each convex portion may include at least one of a hemispherical shape, semi-elliptical shape, or polygonal shape. Here, the substrate 111 may be removed in the light emitting chip 100A, and in this case, the first semiconductor layer 113 or the first conductive type semiconductor layer 115 may be disposed as a top layer of the light emitting chip 100A.

The first semiconductor layer 113 may be formed under the substrate 111. The first semiconductor layer 113 may be formed using compound semiconductors of Group II to V elements. The first semiconductor layer 113 may be formed in at least one layer or a plurality of layers using compound semiconductors of Group II to V elements. The first semiconductor layer 113 may include a semiconductor layer using, for example, compound semiconductors of Group III-V elements, for example, at least one of GaN, InN, AlN, InGaN, AlGaN, InAlGaN, AlInN, AlGaAs, GaP, GaAs, GaAsP, AlGaInP, and GaP. The first semiconductor layer 113 has a composition formula of $In_xAl_yGa_{1-x-y}N$ ($0 \le x \le 1$, $0 \le y \le 1$, $0 \le x+y \le 1$), and may be formed as at least one of a buffer layer and an undoped semiconductor layer. The buffer layer may reduce the difference of lattice constant between the substrate and the nitride semiconductor layer, and the undoped semiconductor layer may improve the crystal quality of semiconductor. Here, the first semiconductor layer 113 may not be formed.

The light emitting structure 120 may be formed under the first semiconductor layer 113. The light emitting structure 120 is selectively formed from compound semiconductors of Group II to V elements and Group III-V elements, and may emit a predetermined peak wavelength within a wavelength range from the ultraviolet band to the visible light band.

The light emitting structure 120 includes a first conductive type semiconductor layer 115, a second conductive type semiconductor layer 119, and an active layer 117 formed between the first conductive type semiconductor layer 115 and the second conductive type semiconductor layer 119. Another semiconductor layer may be further disposed at least one of above and under of the respective layers 115, 117, and 119, but is not limited thereto.

The first conductive type semiconductor layer 115 may be disposed under the first semiconductor layer, and may be implemented as a semiconductor doped with a first conductive type dopant, for example, an n-type semiconductor layer. The first conductive type semiconductor layer 115 includes a composition formula of $In_xAl_yGa_{1-x-y}N$ ($0 \leq x \leq 1$, $0 \leq y \leq 1$, $0 \leq x+y \leq 1$). The first conductive type semiconductor layer 115 may be selected from compound semiconductors of Groups III-V elements, for example, GaN, AlN, AlGaN, InGaN, InN, InAlGaN, AlInN, AlGaAs, GaP, GaAs, GaAsP, and AlGaInP. The first conductive type dopant is an n-type dopant, and includes a dopant, such as Si, Ge, Sn, Se, or Te.

The active layer 117 is disposed under the first conductive type semiconductor layer 114, and selectively includes a single quantum well, a multiple quantum well (MQW), a quantum wire structure, or a quantum dot structure, and includes the period of the well layer and barrier layer. The period of the well layer/barrier layer includes at least one of, for example, InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs pairs.

The second conductive type semiconductor layer 119 is disposed under the active layer 117. The second conductive type semiconductor layer 119 includes a composition formula of a semiconductor doped with a second conductive type dopant, for example, $In_xAl_yGa_{1-x-y}N$ ($0 \leq x \leq 1$, $0 \leq y \leq 1$, $0 \leq x+y \leq 1$). The second conductive type semiconductor layer 119 may be formed of at least one of compound semiconductors, such as GaN, InN, AlN, InGaN, AlGaN, InAlGaN, AlInN, AlGaAs, GaP, GaAs, GaAsP, and AlGaInP. The second conductive type semiconductor layer 119 may be a p-type semiconductor layer, and the first conductive type dopant may be a p-type dopant and include Mg, Zn, Ca, Sr, and Ba.

As another example of the light emitting structure 120, the first conductive type semiconductor layer 115 may be implemented as a p-type semiconductor layer and the second conductive type semiconductor layer 119 may be implemented as an n-type semiconductor layer. A third conductive type semiconductor layer having the polarity opposite to that of the second conductive type may be formed on the second conductive type semiconductor layer 119. In addition, the light emitting structure 120 may be implemented in a structure of any one of an n-p junction structure, a p-n junction structure, an n-p-n junction structure, and a p-n-p junction structure.

An electrode layer 131 is formed under the second conductive type semiconductor layer 119. The electrode layer 131 may include a reflective layer. The electrode layer 131 may include an ohmic contact layer in contact with the second conductive type semiconductor layer 119 of the light emitting structure 120. The reflective layer may be selected from materials having a reflectance of 70% or more, for example, metals, such as of Al, Ag, Ru, Pd, Rh, Pt and Ir and alloys of two or more of the metals. The metal of the reflective layer may be in contact with a lower portion of the second conductive type semiconductor layer 119. The ohmic contact layer may be selected from transparent materials, metals, or non-metal materials.

The electrode layer 131 may include a stacking structure of a transparent electrode layer/a reflective layer. The transparent electrode layer may be formed from, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, and selective combinations thereof. A reflective layer of a metal material may be disposed under the transparent electrode layer, and may be formed of a material selected from, for example, Ag, Ni, Al, Rh, Pd, Ir, Ru, Mg, Zn, Pt, Au, Hf and selective combinations thereof. As another example, the reflective layer may be formed in a distributed Bragg reflection (DBR) structure in which two layers having different refractive indices are alternately arranged.

A light extraction structure, such as roughness, may be formed on a surface of at least one of the second conductive type semiconductor layer 119 and the electrode layer 131, and such a light extraction structure changes the critical angle of the incident light, thereby improving the efficiency of light extraction.

The insulating layer 133 is disposed under the electrode layer 131, and may be disposed on a bottom surface of the second conductive type semiconductor layer 119, side surfaces of the second conductive type semiconductor layer 119 and the active layer 117, and a partial region of the first conductive type semiconductor layer 115. The insulating layer 133 is formed in a region excluding the electrode layer 131, the first electrode 135, and the second electrode 137, from the regions of a lower portion of the light emitting structure 120, thereby electrically protecting the lower portion of the light emitting structure 120.

The insulating layer 133 includes an insulating material or an insulating resin formed of at least one of oxides, nitrides, fluorides, and sulfides having at least one of Al, Cr, Si, Ti, Zn, and Zr. The insulating layer 133 may be selectively formed from, for example, $SiO_2$, $Si_3N_4$, $Al_2O_3$, and $TiO_2$. The insulating layer 133 may be formed in a single layer or multiple layers, but is not limited thereto. The insulating layer 133 is formed to prevent an interlayer short circuit of the light emitting structure 120 when a metal structure for flip binding is formed under the light emitting structure 120.

The insulating layer 133 may be formed in a distributed Bragg reflector (DBR) structure in which first and second layers having different refractive indices are alternately arranged. The first layer may be formed of one of $SiO_2$, $Si_3N_4$, $Al_2O_3$, and $TiO_2$, and the second layer may be formed of any one of the materials other than the material for the first layer, but are not limited thereto. Alternatively, the first layer and the second layer may be formed of the same material or a pair having three or more layers. In this case, the electrode layer may not be formed.

The first electrode 135 may be disposed under a portion of the first conductive type semiconductor layer 115, and the second electrode 137 may be disposed under a portion of the electrode layer 131. The first connection electrode 141 is disposed under the first electrode 135, and the second connection electrode 143 is disposed under the second electrode 137.

The first electrode 135 is electrically connected to the first conductive type semiconductor layer 115 and the first connection electrode 141, and the second electrode 137 may be electrically connected to the second conductive type semiconductor layer 119 and the second connection electrode 143 through the electrode layer 131.

The first electrode 135 and the second electrode 137 may be formed of at least one of Cr, Ti, Co, Ni, V, Hf, Ag, Al, Ru, Rh, Pt, Pd, Ta, Mo, and W or an alloy thereof, or may be formed in a single layer or multiple layers. The first electrode 135 and the second electrode 137 may be formed in the same stacking structure or different stacking structures. At least one of the first electrode 135 and the second electrode 137 may have a current diffusion pattern, such as an arm or a finger structure. In addition, the first electrode 135 and the second electrode 137 may be formed as one or a plurality of electrodes, but are not limited thereto. At least one of the first and second connection electrodes 141 and 143 may be disposed as a plurality of electrodes, but are not limited thereto.

The first connection electrode 141 and the second connection electrode 143 provide a lead function for providing power and a heat dissipation path. The first connection electrode 141 and the second connection electrode 143 may include at least one of shapes, such as a circular shape, a polygonal shape, a circular column, and a polygonal column. The first connection electrode 141 and the second connection electrode 143 may be formed of a metal powder material, for example, any one of Ag, Al, Au, Cr, Co, Cu, Fe, Hf, In, Mo, Ni Si, Sn, Ta, Ti, W, and selective alloys of these metals. The first connection electrode 141 and the second connection electrode 143 may be plated with any one metal of In, Sn, Cu, and selective alloys thereof for the enhancement of adhesive strength with the first electrode 135 and the second electrode 137.

The support layer 140 includes a thermally conductive material, and may be provide around the first electrode 135, the second electrode 137, the first connection electrode 141, and the second connection electrode 143. Here, bottom surfaces of the first and second connection electrodes 141 and 143 may be exposed to a bottom surface of the support layer 140.

The support layer 140 is used as a layer for supporting the light emitting device 100. The support layer 140 is formed of an insulating material, and the insulating material is formed of a resin layer, such as silicone or epoxy. As another example, the insulating material may include a paste or an insulation ink. The kind of the insulating material may include polyacrylate resin, epoxy resin, phenolic resin, polyamides resin, polyimides rein, unsaturated polyesters resin, polyphenylene ether resin (PPE), polyphenilene oxide resin (PPO), polyphenylenesulfides resin, cyanate ester resin, benzocyclobutene (BCB), polyamido-amine dendrimers (PAMAM), polypropylene-imine, dendrimers (PPI), and PAMAM-organosilicon (OS) having an internal structure of PAMAM and an outer surface of organosilicon, alone or a combination thereof. The support layer 140 may be formed of a different material from the insulating layer 133.

At least one of compounds, such as oxides, nitrides, fluoride, and sulfides having at least one of Al, Cr, Si, Ti, Zn, and Zr, may be added into the support layer 140. Here, the compound added in the support layer 140 may be a thermal diffusion agent, and the thermal diffusion agent may be used as powder particles having a predetermined size, granules, filler, or an additive. The thermal diffusion agent includes a ceramic material, and the ceramic material includes at least one of low temperature co-fired ceramic (LTCC), high temperature co-fired ceramic (HTCC), alumina, quartz, calcium zirconate, forsterite, SiC, graphite, fused silica, mullite, cordierite, zirconia, beryllia, and aluminum nitride. The ceramic material may be formed of a metal nitride having higher thermal conductivity than nitrides or oxides among insulating materials, such as nitrides or oxides. The metal nitride may include materials having a thermal conductivity of, for example, 140 W/mK or more. The ceramic material may include ceramic-based materials, such as $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and AlN. The thermally conductive material may include a C-component (diamond or CNT).

The light emitting chip 100A is mounted on the circuit board 400 in a flip manner. The circuit board 400 includes a circuit layer (not shown) having a metal layer 471, an insulating layer 472 on the metal layer 471, and a plurality of lead electrodes 473 and 474 on the insulating layer 472 and a protective layer 475 for protecting the circuit layer. The metal layer 471, which is a heat dissipation layer, contains a metal having high thermal conductivity, such as Cu or a Cu-alloy, and may be formed in a single-layer or multi-layer structure.

The insulating layer 472 insulates between the metal layer 471 and the circuit layer. The insulating layer may include at least one of resin materials, such as epoxy, silicone, glass fiber, prepreg, polyphthalamide (PPA), liquid crystal polymer (LCP), and polyamide 9T. In addition, an additive, for example, a metal oxide, such as $TiO_2$, $SiO_2$, or $Al_2O_3$, may be added into the insulating layer 472, but is not limited thereto. As another example, the insulating layer 472 may be used by adding a material, such as graphene, into an insulating material, such as silicone or epoxy, but is not limited thereto.

The insulating layer 472 may be an anodized region formed by an anodizing process of the metal layer 471. Here, the metal layer 471 may be formed of aluminum, and the anodized region may be formed of a material, such as $Al_2O_3$.

The first and second lead electrodes 473 and 474 are electrically connected to the first and second connection electrodes 141 and 143 of the light emitting chip 100A. Conductive adhesives 461 and 462 may be disposed between the first and second lead electrodes 473 and 474 and the connection electrodes 141 and 143 of the light emitting chip 100A. The conductive adhesives 461 and 462 may contain a metal material, such as a solder material. The first lead electrodes 473 and the second lead electrodes 474, which are circuit patterns, supply power.

The protective layer 475 may be disposed on the circuit layer. The protective layer 475 contains a reflective material, and may be formed of a resist material, such as a white or green resist material, but is not limited thereto. The protective layer 475 may function as a reflective layer, and may be formed of, for example, a material of which the reflectance is higher than the absorptance. A portion of the protective layer 475 may be exposed to the open region 605 of the reflective sheet 600 to reflect the incident light. As another example, the protective layer 475 may be formed of a light-absorbing material. The light-absorbing material may contain a black resist material, and absorbs the light incident through the open region 605, thereby preventing the influence on the uniformity of light.

An example of the optical lens 300 will be described with reference to FIGS. 14 to 22.

Referring to FIG. 14, the ratio of the height h1 of the optical lens 300 to the height difference h2 between the highest point and the lowest point of the reflective surface 330 may be 1:0.7 to below 1:1. The height h1 of the optical lens 300 is a vertical distance from the bottom surface 312 of the optical lens 300 to the highest point of the reflective surface 330 of the optical lens 300, and the height difference h2 between the highest point and the lowest point of the reflective surface 300 may be the depth at which the reflective surface 330 is concave, specifically, may be a distance from the highest point to the lowest point of the reflective surface 330 in a vertical direction.

If the ratio of the height h1 of the optical lens 300 to the height difference h2 between the highest point and the lowest point of the reflective surface 330 is below 1:0.7, the amount of light totally reflected by the reflective surface 330 among the light incident through the incident surface 320 may be reduced.

If the ratio of the height h1 of the optical lens 300 to the height difference h2 between the highest point and the lowest point of the reflective surface 330 is 1:1, the reflective surface 330 of the optical lens 300 may be flat, and if the ratio is above 1:1, a middle portion of the reflective surface 330 of the optical lens 300 may be convex, so that the incident light is transmitted through the reflective surface 330 or the light reflected by the reflective surface 330 is condensed at the peripheral region of the optical lens 300.

The protrusion structure 340 of the optical lens 300 protrudes outwards the lower portion of the exit surface 335, and may be disposed in a plurality of regions or around the lower circumference. The protrusion structure 340 may be a structure for supporting the injection molded product in the injection process of the optical lens 300, or may allow the outside of the bottom surface 312 to be further extended. The width W3 of the concave portion 315 formed under the optical lens 300 or the incident surface 320 may be larger than the width of the light emitting device 100.

Referring to FIGS. 14 and 15, the incident surface 320 on which the light is incident from the optical lens 300 may be a surface of the concave portion 315, and may include a first region R1 facing the center of the light emitting device 100, a third region R3 at the edge, and a second region R2 between the first region R1 and the third region R3. The curvatures of the first region R1, the second region R2, and the third region R3 may be different from one another.

As shown in FIGS. 15 and 16, when a virtual line connecting the center of the reflective surface 330 from the light emitting device 100 is designated as a central axis $Y_0$, the angle $\theta_a$ formed by the first region R1 and the central axis $Y_0$ may be in the range of 0° to 45°, the angle $\theta_1$, formed by the second region R2 and the central axis may be in the range of 30° to 80°, and the angle $\theta_c$ formed by the third region R3 and the central axis $Y_0$ may be in the range of 60° to 90°.

The lights L1, L2, and L3 incident on the first to third regions R1, R2, and R3 may be refracted to travel. The refraction angles of the light L1 passing through the first region R1, the light L2 passing through the second region R2, and the light L3 passing through the third region R3 may be different from one another.

Among the lights emitted from the light emitting device 100, the light L1 passing through the first region R1 is refracted in a direction of the central axis $Y_0$, and the angle $\theta_{a1}$ formed by the light L1 passing through the first region R1 and the central axis after the refraction may be smaller than the angle $\theta_a$ formed by the light L1 passing through the first region R1 and the central axis before the refraction.

In addition, among the lights emitted from the light emitting device 100, the light L2 passing through the second region R2 is refracted in a direction of the central axis $Y_0$, and the angle $\theta_{b1}$ formed by the light L2 passing through the second region R2 and the central axis after the refraction may be smaller than the angle $\theta_b$ formed by the light L2 passing through the second region R2 and the central axis before the refraction.

In addition, among the lights emitted from the light emitting device 100, the light L3 passing through the third region R3 is refracted in a direction of the central axis $Y_0$, and the angle $\theta_{c1}$ formed by the light L3 passing through the third region R3 and the central axis after the refraction may be smaller than the angle $\theta_c$ formed by the light L3 passing through the third region R3 and the central axis before the refraction.

When the changes of the respective angles formed by foregoing light L1, L2, and L3 and the center axis $Y_0$ between before and after the refraction are defined by refraction angles, the light exiting from the light source to pass through the second region R2 may have the largest refraction angle, and the light exiting from the light source to pass through the third region R3 may have the smallest refraction angle.

Meanwhile, at least one of the first region R1, the second region R2, and the third region R3 may have a positive curvature or a negative curvature, or the first region R1, the second region R2, and the third region R3 may have a positive curvature and a negative curvature, but are not limited thereto. For example, all of the first region R1, the second region R2, and the third region R3 may have a positive curvature as shown in FIG. 7, or all may have a negative curvature as shown in FIG. 18. Alternatively, the first region R1 and the third region R3 may have a positive curvature and the second region R2 may have a negative curvature as shown in FIG. 19, and the first region R1 and the third region R3 may have a negative curvature and the second region R2 may have a positive curvature as shown in FIG. 20. The negative curvature and the positive curvature are selectively disposed on the incident surface of the optical lens, so that the path of light can be controlled by receiving the light reflected from the open region of the reflective sheet.

As shown in FIG. 21, the reflective surface 330 of the optical lens 300 may have a shape of which the center of the top portion is depressed, and for example, the optical lens 300 may be depressed to a deeper depth toward the center of the reflective surface 330.

As shown in FIG. 22 and FIG. 1, three support protrusions 350 are shown in the lower portion of the optical lens 300, but two or four support protrusions may be provided. The three support protrusions 350 may be arranged in a triangular shape or another shape.

Another example of the light emitting device of the light emitting module will be described with reference to FIG. 23. Referring to FIG. 23, the light emitting chip 100B of the light emitting device 100 and the circuit board 400 may be connected to each other via connection electrodes 161 and 162, and the connection electrodes 161 and 162 may include conductive pumps, that is, solder bumps. Here, one or a plurality of conductive pumps may be arranged under the respective electrodes 135 and 137, but are not limited thereto.

Another example of the light emitting device will be described with reference to FIG. 24.

Referring to FIG. 24, the light emitting device 100 includes a light emitting chip 200A connected to the circuit board 400. The light emitting device 100 may include a phosphor layer 250 provided on a surface of the light emitting chip 200A. The phosphor layer 250 converts the wavelength of the incident light. As shown in FIG. 4, the optical lens (300 in FIG. 4) is disposed on the light emitting device 100 to control the directivity characteristics of the light emitted from the light emitting chip 200A.

The light emitting chip 200A includes a light emitting structure 225 and a plurality of pads 245 and 247. The light emitting structure 225 may be formed of a compound semiconductor layer of Group II to VI elements, for example, a compound semiconductor layer of Group III-V elements, or a compound semiconductor layer of Group II-VI elements. The plurality of pads 245 and 247 are selectively connected to the semiconductor layer of the light emitting structure 225 to supply power.

The light emitting structure 225 includes a first conductive type semiconductor layer 222, an active layer 223, and a second conductive type semiconductor layer 224. The light emitting chip 200A may include a substrate 221. The substrate 221 is provided on the light emitting structure 225. The substrate 221 may be, for example, a transparent substrate, an insulating substrate, or a conductive substrate. Such a configuration refers to the description of the light emitting structure and the substrate in FIG. 4.

Pads 245 and 247 are provided under the light emitting chip 200A, and the pads 245 and 247 includes first and second pads 245 and 247. The first and second pads 245 and 247 are spaced apart from each other under the light emitting chip 200A. The first pads 245 are electrically connected to the first conductive type semiconductor layer 222, and the second pads 247 are electrically connected to the second conductive type semiconductor layer 224. The bottom shapes of the first and second pads 245 and 247 may be a polygonal or circular shape, or may be formed corresponding to the shapes of the first and second lead electrodes 415 and 417 of the circuit board 400. The area of a bottom surface of each of the first and second pads 245 and 247 may be formed to have a size corresponding to a size of a top surface of each of, for example, the first and second lead electrodes 415 and 417.

The light emitting chip 200A may include at least one of a buffer layer (not shown) and an undoped semiconductor layer (not shown) between the substrate 221 and the light emitting structure 225. The buffer layer is a layer for reducing the difference of lattice constant between the substrate 221 and the semiconductor layer, and may be selectively formed from Groups II to VI compound semiconductors. An undoped Group III-V compound semiconductor layer may be further formed under the buffer layer, but is not limited thereto. The substrate 221 may be removed. When the substrate 221 is removed, the phosphor layer 250 may be in contact with a top surface of the first conductive type semiconductor layer 222 or a top surface of another semiconductor layer.

The light emitting chip 200A includes first and second electrode layers 241 and 242, a third electrode layer 243, and insulating layers 231 and 233. Each of the first and second electrode layers 241 and 242 may be formed in a single layer or multiple layers, and may function as a current diffusion layer. The first and second electrode layers 241; and 242 may include: a first electrode layer 241 provided under the light emitting structure 225; and a second electrode layer 242 provided under the first electrode layer 241. The first electrode layer 241 diffuses current, and the second electrode layer 241 reflects the incident light.

The first and second electrode layers 241 and 242 may be formed of different materials. The first electrode layer 241 may be formed of a transparent material, for example, a metal oxide or a metal nitride. The first electrode layer may be selectively formed from, for example, indium tin oxide (ITO), ITO nitride (ITON), indium zinc oxide (IZO), IZO nitride (IZON), indium zinc tin oxide (IZTO), (indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO). The second electrode layer 242 is in contact with a bottom surface of the first electrode layer 241, and may function as a reflective electrode layer. The second electrode 242 may contains a metal, such as Ag, Aul, or Al The second electrode layer 242 may be in partial contact with the bottom surface of the light emitting structure 225 when a partial region of the first electrode layer 241 is removed As another example, the structures of the first and second electrode layers 241 and 242 may be stacked in an omnidirectional reflector layer (ODR) structure. The omnidirectional reflective structure may be formed in a stacking structure of the first electrode layer 241 having a low refractive index and a second electrode layer 242 in contact with the first electrode layer 241 and formed of a highly reflective metal material. The electrode layers 241 and 242 may be formed in a stacking structure of, for example, ITO/Ag. Therefore, the total reflective angle at the interface between the first electrode layer 241 and the second electrode layer 242 can be improved.

As another example, the second electrode layer 242 may be removed, and may be formed as a reflective layer of another material. The reflective layer may be formed in a distributed Bragg reflector (DBR) structure. The dispersion Bragg reflector structure includes a structure in which two dielectric layers having different refractive indices are alternately arranged, and the two dielectric layers each may include any different one of, for example, a $SiO_2$ layer, a $Si_3N_4$ layer, a $TiO_2$ layer, an $Al_2O_3$ layer, and a MgO layer. As another example, the electrode layers 241 and 242 may include both of a dispersed Bragg reflective structure and an omnidirectional reflective structure. In this case, a light emitting chip 200A having a light reflectance of 98% or more can be provided. The light reflected from the second electrode layer 242 is emitted through the substrate 221, and thus, the light emitting chip 200A mounted in a flip-type can emit most of the light in a vertical upward direction. The light emitted through the lateral surface of the light emitting chip 200A may be reflected to the region of the incident surface of the optical lens by the reflective sheet 600.

The third electrode layer 243 is disposed under the second electrode layer 242, and is electrically insulated from the first and second electrode layers 241 and 242. The third electrode layer 243 contains a metal, for example, at least one of titanium (Ti), copper (Cu), nickel (Ni), gold (Au), chromium (Cr), tantalum (Ta), platinum (Pt), tin (Sn), silver (Ag), and phosphorus (P). First pads 245 and second pads 247 are disposed under the third electrode layer 243. The insulating layers 231 and 233 prevent an unnecessary contact between the layers of the first and second electrode layers 241 and 242, the third electrode layer 243, the first and second pads 245 and 247, and the light emitting structure 225. The insulating layers 231 and 233 include first and second insulating layers 231 and 233. The first insulating layer 231 is disposed between the third electrode layer 243 and the second electrode layer 242. The second insulating layer 233 is disposed between the third electrode layer 243 and the first and second pads 245 and 247. The first and second pads 245 and 247 may contain the same material as the first and second lead electrodes 415 and 417.

The third electrode layer 243 is connected to the first conductive type semiconductor layer 222. A connection portion 244 of the third electrode layer 243 protrudes in a via structure through the first and second electrode layers 241 and 242 and a lower portion of the light emitting structure 225, and is in contact with the first conductive type semiconductor layer 225. The connection portion 244 may be disposed as a plurality of connection portions. A portion 232 of the first insulating layer 231 is extended around the connection portion 244 of the third electrode layer 243 to block an electrical connection between the third electrode layer 243 and the first and second electrode layers 241 and 242 and between the second conductive type semiconductor layer 224 and the active layer 223. An insulating layer may be disposed on the side surface of the light emitting structure 225 for the protection of side surfaces, but is not limited thereto.

The second pads 247 are disposed under the second insulating layer 233, and are in contact with or connected to at least one of the first and second electrode layers 241 and 242 through an open region of the second insulating layer 233. The first pads 245 are disposed under the second insulating layer 233, and are connected to the third electrode layer 243 through the open region of the second insulating layer 233. Therefore, the protrusions 248 of the first pads 247 are electrically connected to the second conductive type semiconductor layer 224 through the first and second electrode layers 241 and 242, and the protrusions 246 of the second pads 245 are electrically connected to the first conductive type semiconductor layer 222 through the third electrode layer 243.

The first and second pads 245 and 247 are spaced apart from each other under the light emitting chip 200A, and face the first and second lead electrodes 415 and 417 of the circuit board 400. The first and second pads 245 and 247 may include polygonal recesses 271 and 273, and the recesses 271 and 273 are formed to be convex in a direction of the light emitting structure 225. The recesses 271 and 273 may be formed to have a depth equal to or smaller than the thickness of the first and second pads 245 and 247. The depth of the recesses 271 and 273 may increase the surface area of the first and second pads 245 and 247.

Binding members 255 and 257 are disposed in regions between the first pads 245 and the first lead electrodes 415 and regions between the second pads 247 and the second lead electrodes 417. The binding members 255 and 257 may contain an electrically conductive material, and portions of the binding members 255 and 257 are disposed in the recesses 271 and 273. With respect to the first and second pads 215 and 217, the binding members 255 and 257 are disposed in the recesses 271 and 273, thereby increasing the binding areas between the binding members 255 and 257 and the first and second pads 245 and 247. Accordingly, the first and second pads 245 and 247 are bound to the first and second lead electrodes 415 and 417, thereby improving electrical reliability and heat dissipation efficiency of the light emitting chip 200A.

The binding members 255 and 257 may contain a solder paste material. The solder paste material includes at least one of gold (Au), tin (Sn), lead (Pb), copper (Cu), bismuth (Bi), indium (In), and silver (Ag). Since the binding members 255 and 257 conduct the heat directly to the circuit board 400, the heat conduction efficiency can be improved compared with a structure using a package. In addition, the binding members 255 and 257 are formed of a material having a small difference in thermal expansion coefficient from the first and second pads 245 and 247 of the light emitting chip 200A, thereby improving heat conduction efficiency.

As another example, the binding members 255 and 257 may include a conductive film, and the conductive film includes one or more conductive particles in an insulating film. The conductive particles may contain at least one of, for example, a metal, a metal alloy, and carbon. The conductive particles may contain at least one of nickel, silver, gold, aluminum, chromium, copper, and carbon. The conductive film may include an anisotropic conductive film or an anisotropic conductive adhesive.

An adhesive member, for example, a thermally conductive film may be included between the light emitting chip 200A and the circuit board 400. For the thermally conductive film, polyester resins, such as polyethylene terephthalate, polybutylene terephthalate, polyethylene naphthalate, and polybutylene naphthalate; polyimide resins; acrylic resins; styrene-based resins, such as polystyrene and acrylonitrile-styrene; polycarbonate resins; polylactic acid resins; polyurethane resins; and the like may be used. Also, the thermally conductive film may include: at least one of polyolefin resins, such as polyethylene, polypropylene, and ethylene-propylene copolymers; vinyl resins, such as polyvinyl chloride and polyvinylidene chloride; polyamide resins; sulfone-based resins; polyether-ether ketone-based resins; allylate-based resins; or blends of the above resins.

The light emitting chip 200A emits light through the surface of the circuit board 400 and the side surface and the top surface of the light emitting structure 225, thereby improving the efficiency of light extraction. The light emitting chip 200A may be directly bonded onto the circuit board 400, thereby simplifying the process. In addition, the heat dissipation of the light emitting chip 200A is improved, so that the light emitting chip 200A may be advantageously utilized in an illumination field or the like.

FIG. 25 is a side sectional view showing a display device having light emitting modules according to an embodiment.

Referring to FIG. 25, the display device includes light emitting modules 101 disposed on a bottom cover 710, and optical sheets 712, 713, and 714 and a display panel 715 on the light emitting module 101. The bottom cover 710 may contain a metal or a thermally conductive resin material for heat dissipation, and the light emitting modules 101 may be disposed in one or a plurality of rows on the bottom cover 710. The light emitting module 101 may emit a white light by the light emitting device 100, but is not limited thereto.

A light guide layer 711 may be disposed in a region between the optical sheets 712, 713, and 714 and the light emitting module 101. The light guide layer 711 may be formed of a resin material, such as silicone or epoxy, and may guide and disperse the incident light. The light guide layer 711 may not be formed. The optical sheets 712, 713, and 714 may include prism sheet 714 and 713 for collecting the dispersed light and a diffusion sheet 714 for re-diffusing the condensed light by the prism sheets 712 and 713.

The display panel 715 may be disposed on the optical sheets 712, 713, and 714. The display panel 715 may display an image by light.

FIG. 26 is a graph showing comparison in light distribution among an embodiment and comparative examples 1 and 2.

In FIG. 26, Comparative Example 1 has a structure in which an optical lens is disposed on a light emitting device package having a light emitting chip, and light is extracted through only a top surface, not a side surface, of the light emitting device package. Comparative Example 2 has a structure in which a reflective sheet is removed from the structure in FIG. 2. A light emitting device of Example is a five-sided light emission device that emits light through a top surface and side surfaces, and can adjust the light to a uniform intensity from the center region to the peripheral region compared with the Comparative Examples 1 and 2.

FIG. 27A is a view showing an image according to Example, and FIG. 27B is a view showing an image according to a comparative Example. A comparative example provides a structure in which a reflective sheet is removed from the structure in FIG. 2.

It may be seen that the hot spot phenomenon occurring in the periphery of the center region of the image, as shown in FIG. 27(B), was reduced in FIG. 27(A). Such a hot spot phenomenon occurs due to the reflection of the light generated from the lateral surfaces of the light emitting device by the top surface of the circuit board. In Example, the side light of the light emitting device is reflected by the reflective sheet, so that an image without a hot spot phenomenon may be disposed.

In addition, the luminous fluxes and color coordinates of the light emitting device according to Example and the light emitting device without a reflective sheet (comparative example) are shown in Table 1 below.

TABLE 1

|  | Luminous flux (lm) | Cx | Cy |
| --- | --- | --- | --- |
| Reference | 100% | 0.000 | 0.000 |
| Example | 96.1% | +0.004 | +0.005 |

It may be seen that there was almost no difference in luminous flux and color coordinates of the light emitted from the light emitting device according to Example compared with the reference light emitting device.

The light emitting module according to Example may be applied to a light unit. The light unit includes a structure having one or a plurality of light emitting modules, and may include a three-dimensional display, various illumination lights, a traffic light, a vehicle headlight, an electric signboard, and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment can improve the reliability of the optical lens and the light emitting module having the same.

The embodiment may be applied to illumination devices, such as a three-dimensional display using a light emitting module, various illumination lights, a traffic light, a vehicle headlight, and an electric signboard.

The invention claimed is:

1. A light-emitting module comprising:
a circuit board;
a light emitting device disposed on the circuit board;
an optical lens disposed on the light emitting device;
a reflective sheet disposed between the optical lens and the circuit board; and
an adhesive layer disposed between the reflective sheet and the circuit board,
wherein the optical lens includes a bottom surface, an incident surface having a concave portion recessed from a bottom surface on the light emitting device, a reflective surface for reflecting a light incident on the incident surface, and an exit surface disposed at an outer circumference thereof,
wherein the reflective sheet includes an open region in which the light emitting device is disposed,
wherein the open region of the reflective sheet has a width, which is wider than a width of the light emitting device and narrower than a width of the incident surface of the optical lens in a first direction,
wherein the bottom surface of the optical lens is spaced apart from a top surface of the reflective sheet, and
wherein the reflective sheet has a width wider than a width of the optical lens and wider than a width of the circuit board in the first direction, and
wherein an inner side of the reflective sheet faces a plurality of lateral surfaces of the light emitting device through an air space.

2. The light-emitting module of claim 1, wherein the open region of the reflective sheet has an outer shape identical to an outer shape of the light emitting device.

3. The light-emitting module of claim 1, wherein the open region of the reflective sheet includes a circular shape or a polygonal shape.

4. The light-emitting module of claim 1, wherein the open region of the reflective sheet includes a plurality of curved surfaces having mutually different curvatures,
wherein the plurality of curved surfaces includes a first curved surface having a first curvature corresponding to a lateral surface of the light emitting device and a second curved surface having a second curvature corresponding to a corner region of the light emitting device, and
wherein the first curvature of the first curved surface is greater than the second curvature of the second curved surface.

5. The light-emitting module of claim 1, wherein a side of the open region of the reflective sheet has the same interval from at least two lateral surfaces of the light emitting device.

6. The light-emitting module of claim 1, wherein the inner side of the reflective sheet includes a stepped structure or an inclined surface with respect to the top surface of the reflective sheet.

7. The light-emitting module of claim 1, wherein a side of the open region of the reflective sheet includes an inclined surface with respect to the top surface of the reflective sheet.

8. The light-emitting module of claim 1, wherein the circuit board includes a metal layer, an insulating layer on the metal layer, a circuit layer having a plurality of lead electrodes electrically connected to the light emitting device on the insulating layer,
wherein the light emitting device includes: a light emitting chip having a light emitting structure having an active layer, a substrate on the light emitting structure, and a reflective electrode layer under the light emitting structure, and
wherein a height of the top surface of the reflective sheet is higher than that of a top surface of the light emitting chip.

9. The light-emitting module of claim 8, wherein the light emitting device includes a phosphor layer disposed on a surface of the light emitting chip, and wherein the height of the top surface of the reflective sheet is equal to or lower than that of a top surface height of the phosphor layer.

10. The light-emitting module of claim 9, wherein the phosphor layer is disposed on the top surface and a lateral surface of the light emitting chip.

11. The light-emitting module of claim 9, wherein a lower portion of the optical lens includes a plurality of support protrusions coupled to the circuit board through the reflective sheet, and
wherein the plurality of support protrusions is disposed at an outer region of the open region.

12. The light-emitting module of claim 9, wherein the plurality of lead electrodes includes first and second lead electrodes under the light emitting device,
wherein a lower portion of the light emitting chip includes first and second connection electrodes overlapped vertically with the first and second lead electrodes of the circuit board, and
wherein the first and second lead electrodes are electrically connected to the first and second connection electrodes of the light emitting chip.

13. The light-emitting module of claim 12, wherein the circuit board includes a protective layer of a reflective material disposed under the open region of the reflective sheet.

14. The light-emitting module of claim 12, wherein a plurality of optical lenses and a plurality of reflective sheets are disposed on the circuit board in a second direction orthogonal to the first direction, and
wherein the plurality of reflective sheets is spaced apart from each other.

15. The light-emitting module of claim 1, wherein the concave portion of the optical lens overlaps vertically with an inner portion of the top surface of the reflective sheet, and
wherein the reflective sheet has a length smaller than a length of the circuit board in a second direction orthogonal to the first direction.

16. The light-emitting module of claim 15, wherein an outer shape of the reflective sheet is a circular, elliptic, or polygonal shape.

17. A light unit comprising:
a circuit board;
a plurality of light emitting devices disposed on the circuit board;
a plurality of optical lenses disposed on each of the light emitting devices and the circuit board, respectively;
a plurality of reflective sheets disposed between each of the optical lenses and the circuit board, respectively; and
an adhesive layer disposed between each of the reflective sheets and the circuit board,
wherein the optical lens includes a bottom surface, an incident surface having a concave portion recessed from a bottom surface on the light emitting device and an exit surface for emitting a light incident on the incident surface thereof,
wherein the reflective sheet has an inner side facing a lateral surface of the light emitting device under the concave portion,
wherein the bottom surface of the optical lens is spaced apart from a top surface of the reflective sheet,
wherein the reflective sheet has a width wider than a width of the circuit board in a first direction,
wherein the reflective sheet has a length smaller than a length of the circuit board in a second direction orthogonal to the first direction,
wherein the reflective sheet has an area greater than that of the bottom surface of the optical lens,
wherein a lower portion of the optical lens includes a plurality of support protrusions coupled to the circuit board through the reflective sheet,
wherein inner sides of the reflective sheet face a plurality of lateral surfaces of the light emitting device, and
wherein an area between the inner side of the reflective sheet and the light emitting device is an air space.

18. The light unit of claim 17, wherein an open region of the reflective sheet includes a circular shape or a polygonal shape.

19. The light unit of claim 17, wherein an outer portion of the reflective sheet is disposed outwardly from the bottom surface of the optical lens, and
wherein an inner portion of the reflective sheet is vertically overlapped with the incident surface of the optical lens.

20. The light unit of claim 17, wherein the circuit board includes a metal layer, an insulating layer on the metal layer, a circuit layer having a plurality of lead electrodes electrically connected to the light emitting device on the insulating layer,
wherein the support protrusions of the optical lens contacts the metal layer of the circuit board, and
wherein the reflective sheet has a protrusion hole into which the support protrusion is inserted.

* * * * *